s009985058B2

United States Patent
Barker et al.

(10) Patent No.: US 9,985,058 B2
(45) Date of Patent: May 29, 2018

(54) DUAL BAND ULTRAVIOLET (UV) AND INFRARED RADIATION DETECTOR

(71) Applicant: Raytheon Company, Waltham, MA (US)

(72) Inventors: Delmar L. Barker, Tucson, AZ (US); Jeffrey Clarke, Rio Rico, AZ (US); Charles W. Hicks, Tucson, AZ (US); Marguerite J. Green, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 0 days. days.

(21) Appl. No.: 15/278,619

(22) Filed: Sep. 28, 2016

(65) Prior Publication Data

US 2018/0090525 A1    Mar. 29, 2018

(51) Int. Cl.
| | |
|---|---|
| *H01L 27/14* | (2006.01) |
| *H01L 31/02* | (2006.01) |
| *H01L 27/144* | (2006.01) |
| *H01L 31/0296* | (2006.01) |
| *H01L 31/0216* | (2014.01) |
| *H01L 31/108* | (2006.01) |
| *H01L 31/18* | (2006.01) |
| *G01J 1/42* | (2006.01) |

(52) U.S. Cl.
CPC ...... *H01L 27/1443* (2013.01); *H01L 31/0296* (2013.01); *H01L 31/02161* (2013.01); *H01L 31/02162* (2013.01); *H01L 31/108* (2013.01); *H01L 31/1828* (2013.01); *G01J 1/429* (2013.01)

(58) Field of Classification Search
CPC ..... H01L 31/02; H01L 31/021; H01L 31/029; H01L 31/0216; H01L 31/0296; H01L 31/02161; H01L 31/02162; H01L 31/10; H01L 31/108; H01L 31/18; H01L 31/182; H01L 31/1828; H01L 27/14; H01L 27/144; H01L 27/1443
USPC .......................................................... 257/432
See application file for complete search history.

(56) References Cited

U.S. PATENT DOCUMENTS

| | | |
|---|---|---|
| 4,000,502 A | 12/1976 | Butler et al. |
| 4,319,258 A | 3/1982 | Harnagel et al. |
| 2007/0241279 A1 | 10/2007 | Starikov et al. |
| 2012/0181645 A1* | 7/2012 | Espiau De Lamaestre ......... H01L 31/0232 257/432 |
| 2016/0111579 A1 | 4/2016 | Shi et al. |

FOREIGN PATENT DOCUMENTS

WO    WO 2016/126693 A1    8/2016

OTHER PUBLICATIONS

U.S. Appl. No. 15/278,656, filed Sep. 28, 2016, 17 pages.
(Continued)

*Primary Examiner* — Monica D Harrison
(74) *Attorney, Agent, or Firm* — Daly, Crowley, Mofford & Durkee, LLP

(57) ABSTRACT

A dual band infrared and ultraviolet radiation detector having an ultraviolet radiation detector embedded within a pair of IR anti-reflection layers wherein a first one of the infrared anti-reflection layer reflects ultraviolet energy passing through from the semiconductor, ultraviolet radiation detector back to the semiconductor, ultraviolet radiation detector.

17 Claims, 28 Drawing Sheets

(56) References Cited

OTHER PUBLICATIONS

Alvin M. Goodman, Evaporated Metallic Contacts to Conducting Cadmum Sulfide Single Crystals, AIP Journal of Applied Phgysics, 1964, pp. 573-580 (9 pages).

John A. Scott-Monck, Arthur J. Learn, Rectifying Contacts Under Evaporated CdS, IEEE, Jan. 1968, pp. 68-69 (2 pages).

C. Paorici, C. Pelosi, G. Bolzoni, G. Zuccalli, Epitaxial growth of cadium sulphide on (111) germanium substrates, Journal of Materials Science 10, 1975, pp. 2117-2123 (7 pages).

V.V. Antipov, S.A. Kukushkin, A.V. Osipov, Epitaxial Growth of Cadium Sulfide Films on Silicon, ISSN 1063-7384, Physics of the Solid State, 2016, vol. 58, No. 3, pp. 629-632 (4 pages).

Michael Krumrey, Erich Tegeler, Jochen Barth, Michael Krisch, Franz Schäfers, Reinhard Wolf, Schottky type photodiodes as detectors in the VUV and soft x-ray range, Applied Optics, vol. 27, No. 20, Oct. 15, 1998, pp. 4336-4341 (6 pages).

L.C. Greene, D.C. Reynolds, S.J. Czyzak, W.M. Baker, Method for Growing Large CdS and ZnS Single Crystals, AIP The Journal of Chemical Physics, vol. 29, No. 6, Dec. 1958, pp. 1375-1380 (7 pages).

Ralph M. Grant, Photoelectrically Induced Free Carrier Absorption and Amplification of Light in Cadmium Sulfide, Applied Optics, vol. 5, No. 2, Feb. 1966, pp. 333-341 (9 pages).

Raymond T. Tung, The physics and chemistry of the Schottky barrier height, AIP Applied Physics Review, 2014, pp. 011304-1-01130454 (55 pages).

G.H. Dierssen, T. Gabor, Seeded Growth of Large Single Crystals of CdS From the Vapor Phase, Journal of Crystal Growth 43, 1978, pp. 572-576 (5 pages).

F. Lisco, P.M. Kaminski, A. Abbas, J.W. Bowers, G. Claudio, M. Losurdo, J.M. Walls, High rate deposition of thin film cadmium sulphide by pulsed direct current magnetron sputtering, Thin Solid Films 574, 2015, pp. 43-51 (9 pages).

Alvin M. Goodman, Evaporated Metallic Contacts to Conducting Cadmium Sulfide Single Crystals, AIP Journal of Applied Physics, 1963, pp. 573-580 (9 pages).

C.K. Campbell, C.H. Morgan, Some Studies of Thin Film Diodes Utilizing Cadmium Sulphide and Sulpher, Thin Solid Films, 26, 1975, pp. 213-220 (8 pages).

C. Ghezzi, C. Paorici, C. Pelosi, Growth and Defect Structure of CdS Epitaxial Layers on (111)Ge Substrates, Journal of Crystal Growth 41, 1977, pp. 181-191 (11 pages).

John A. Scott-Monck, Arthur J. Learn, Rectify Contacts Under Evaporated CdS, IEEE, Jan. 1968, 2 pages.

Notification of Transmittal of the International Search Report and the Written Opinion of the International Searching Authority, or the Declaration, PCT/US2017/024698, dated Jul. 21, 2017, 1 page.

International Search Report, PCT/US2017/024698, dated Jul. 21, 2017, 5 pages.

Written Opinion of the International Searching Authority, PCT/US2017/024698, dated Jul. 21, 2017, 11 pages.

Andrzej Szczerbakow, elf electing Vapor Growth of Monocrystals: An Alternative in the Area of Wide-Gap II-IV Solid Soiutions, Crystal Growth & Design, 2001, vol. 1, No. 3, pp. 183-185 (3 pages).

P.R. Kamadjiev, M.M. Gospodinov, On the Morphoiogy of Cadmium Sulphide Epitaxial Layers on Germanium, Observation of Six-Pointed Star Optic Figures and their Explanation, Institute of Solid State Physics, Bulgarian Academy of Sciences Sofia, Bulgaria, 1977, vol. 12, No. 6, pp. 573-586 (15 pages).

L. Clark and J. Woods, the preparation of large single crystals of cadmium sulphide, Department of Applied Physics, University of Durham, Brit. J. Appl. Phys., 1968, vol. 17, pp. 319-325 (8 pages).

J.W. Sherohman, Two Phase Annealing of Single Crystal CdS, Lawrence Livermore National Laboratory, University of California, Livermore, California 94550, Aug. 1981, vol. 128, No. 8, pp. 1817-1819 (3 pages).

P. Baeri, C. Spinella, R. Reitano, Fast Melting of Amorphous Silicon Carbide induced by Nanosecond Laser Pulse, International Journal of Thermophysics, 1999, vol. 20, No. 4, pp. 1211-1221 (11 pages).

V.V. Anitpov, S.A. Kukushkin, A.V. Osipov, Epitaxial Growth of Cadium Sulfide Flims on Silicon, Physics of the Solid State, 2016, vol. 58, No. 3, pp. 629-632 (4 pages).

Ciprian Iliescu, Daniel Poenar, Physics and Technology of Silicon Carbide Devices, PEVD Amorphous Silicon Carbide (a-SiC) Layers for MEMS Applications, Oct. 16, 2012, pp. 130-148 (19 pages).

* cited by examiner

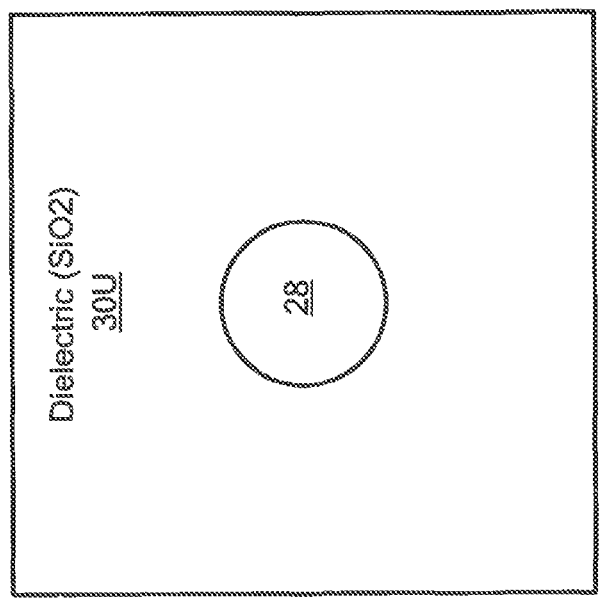
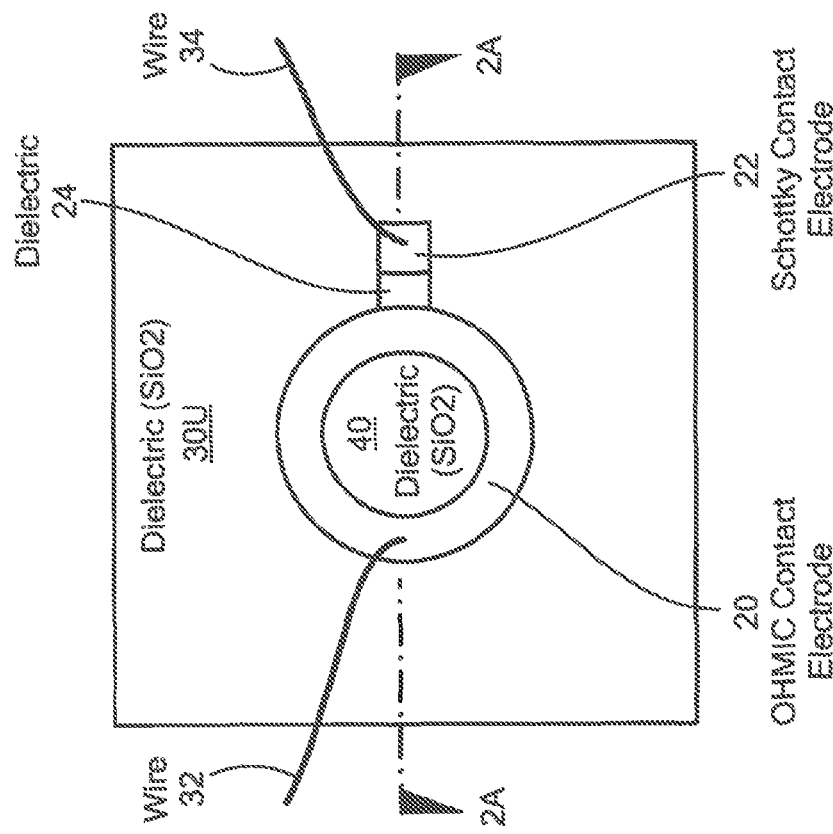
FIG. 2C
FIG. 2B

DUAL BAND ULTRAVIOLET (UV) AND INFRARED RADIATION DETECTOR

TECHNICAL FIELD

This disclosure relates generally to dual band ultraviolet (UV) and infrared (IR) radiation detectors.

BACKGROUND

As is known in the art, in many applications it is desired to detect both infrared and ultraviolet radiation from an object or distinguish between two different objects at a common pixel of an array of detector elements; sometimes referred to as dual band UV and Infrared (IR) radiation detectors. One such detector is shown in FIG. 1 to include an infrared detector, here of Indium-Antimonide, mounted below a semiconductor, ultraviolet radiation detector, such as Cadmium Sulfide (CdS) bulk crystal approximately 0.5 mm thick, as shown (or Cadmium Selenide (CdSe) or Cadmium Telluride CdTe); the ultraviolet detector having the bottom surface epoxied with an IR transparent epoxy, to a filter, here silicon, for passing infrared energy passing through the ultraviolet detector to the infrared detector. It is noted that a Schottky contact is formed on the upper surface of the CdS, forming a Schottky barrier region approximately 10 nm thick. One such UV detector is a Schottky barrier photovoltaic detector described in U.S. Pat. No. 4,319,258 issued Mar. 9, 1982, inventors Harnagel et al. Here, a metal electrode, such as platinum (Pt) and gold (Au), interacts through proper reaction with CdS interface to form a Schottky bather rectifying junction. As described therein a slice is taken from a single crystalline cadmium sulfide ingot designated as being of the N-type with a preferred orientation for slicing the wafer such that the c-axis of the hexagonal crystal is perpendicular to the surface of the wafer. The wafer is next etched in a solution of hydrochloric acid to identify the positive and negative orientation sides of the wafer. The wafer is then mounted on a work fixture and lapped flat to a suitable thickness. Following the lapping operation, the wafer is polished. The wafer is then processed to form an infrared shield on the upper surface of the cadmium sulfide substrate which is chosen so that it is the cadmium-rich side of the wafer. Preferably, the infrared shield structure is composed of a layer gold which is opaque to infrared radiation, sandwiched between thin layers of an adhesion metal. The adhesion metal is preferably titanium but it also may be aluminum, magnesium, zirconium, hafnium, or alloys of various combinations thereof. Preferably, the layer of gold is sandwiched between two relatively thin layers of titanium. Also, acid etching had to be performed to prepare the Schottky surface layer for correct electrical performance.

As is also known in the art, Cadmium Sulfide-Schottky contact junctions have been discussed in a paper entitled Rectifying Contacts Under Evaporated CdS" by JOHN A. SCOTT-MONCK ARTHUR J. LEARN, published PROCEEDINGS OF THE IEEE, JANUARY 1968 page 68.

SUMMARY

In accordance with the disclosure, a dual band infrared and ultraviolet radiation detector is provided having: an infrared radiation detector; an infrared radiation filter, disposed over infrared radiation detector, the infrared radiation filter being transparent to infrared radiation band and absorptive to radiation adjacent to the infrared radiation band; and an ultraviolet radiation detector disposed over the substrate. The ultraviolet radiation detector comprises: a Schottky contact metal layer on an upper surface of the infrared radiation filter; a vapor deposited layer of a semiconductor ultraviolet radiation detection material disposed directly on, and forming a Schottky contact with, the metal layer; and an ohmic contact metal in ohmic contact with a portion of the layer of CdS. Radiation in both the infrared band and in the ultraviolet band passes through the ultraviolet radiation detector and the ultraviolet radiation is intercepted and detected by the ultraviolet radiation detector and infrared radiation passes through the ultraviolet radiation is intercepted and detected by the infrared radiation detector.

In one embodiment the semiconductor radiation detection material is vapor deposited material.

In one embodiment, the semiconductor ultraviolet radiation detection material layer is a chemically vapor deposited layer on the Schottky contact metal layer.

In one embodiment, the Schottky contact metal layer and the ohmic contact metal layer are disposed on opposite surfaces of the layer of a semiconductor ultraviolet radiation detection material.

In one embodiment, the layer of a semiconductor ultraviolet radiation detection material has a thickness in a range of 0.25 to 2 micron.

In one embodiment, the Schottky contact metal layer extends laterally along a surface of the layer of a semiconductor ultraviolet radiation detection material and wherein the layer of a semiconductor ultraviolet radiation detection material has a c-axis perpendicular to the upper surface of the layer of a semiconductor ultraviolet radiation detection material. With such an arrangement, the growth of large single crystals of a semiconductor ultraviolet radiation detection material is avoided by the firming the semiconductor ultraviolet radiation detection material layer using a chemical vapor deposition process directly on the Schottky contact metal layer forming a Schottky contact between the Schottky contact metal layer and the a semiconductor ultraviolet radiation detection material. This is possible because the c-axis of the semiconductor ultraviolet radiation detection material spontaneously aligns perpendicular to the Schottky contact metal and Ohmic contact metals. Thus, the thick crystals that are used in the prior art are eliminated by, in accordance with the disclosure, depositing a relatively thin layer of a semiconductor ultraviolet radiation detection material on a metallized Silicon IR filter. The IR filter is used as the mechanical support of the Schottky barrier diode a semiconductor ultraviolet radiation detection material instead of a thick wafer of a semiconductor ultraviolet radiation detection material that is epoxied to the infrared filter. Thus, while the above referenced paper entitled "Rectifying Contacts Under Evaporated CdS" by JOHN A. SCOTT-MONCK ARTHUR J. LEARN, published PROCEEDINGS OF THE IEEE, JANUARY 1968 page 68 discusses forming Cadmium Sulfide-Schottky contact junctions, the inventors have recognized that forming such junctions with very thin Cadmium Sulfide, on the order of one micron thick, enables fabrication of very thin ultraviolet detectors particularly in dual band ultraviolet (UV) and infrared (IR) radiation detectors.

In one embodiment, a dual hand infrared (IR) and ultraviolet (UV) radiation detector is provided having: an infrared radiation (IR) detector; an infrared radiation filter, disposed over infrared radiation detector, the infrared radiation filter being transparent to infrared radiation band and absorptive to radiation adjacent to the infrared radiation band; and, an ultraviolet radiation detector disposed over the infrared radiation filter. The ultraviolet radiation detector includes: an anti-reflection structure for the IR detector, comprising: an semiconductor ultraviolet radiation detection material detecting layer for detecting UV radiation; and an IR anti-reflection glass disposed under the semiconductor ultraviolet radiation detection material detecting layer. The IR anti-reflection (IR AR) glass is greater than the index of refraction of the semiconductor ultraviolet radiation detection material UV detecting layer wherein UV energy passing through the semiconductor ultraviolet radiation detection material UV detecting layer is reflected by the IR anti-reflection glass back to the CdS layer for increased absorption by the a semiconductor ultraviolet radiation detection material UV detecting layer.

With such an arrangement, the a semiconductor ultraviolet radiation detection material layer is now a functional part of the IR anti-reflection coating provided to the IR detector and therefore serves a dual purpose; an anti-reflection coating for the IR detector and detection of the UV energy.

In one embodiment, the IR AR glass reflects some of the UV radiation that might be lost because of insufficient absorption in the thin, on the order of one micron thick detector material.

In one embodiment, the semiconductor ultraviolet radiation detection material UV detecting layer comprises a portion of an infrared radiation anti-reflection system.

In one embodiment, a dual band infrared (IR) and ultraviolet (UV) radiation detector is provided, comprising: an infrared radiation (IR) detector; an infrared radiation filter, disposed over infrared radiation detector, the infrared radiation filter being transparent to infrared radiation band and absorptive to radiation adjacent to the infrared radiation band; and an ultraviolet radiation detector structure disposed over the infrared radiation filter. The ultraviolet radiation detector structure comprises: a first infrared anti-reflection layer disposed on the infrared radiation filter; a semiconductor, ultraviolet radiation detector disposed over the first infrared anti-reflection layer; and a second infrared anti-reflection layer disposed on the semiconductor, ultraviolet radiation detector.

In one embodiment, the index of refraction of the second infrared anti-reflection layer to IR radiation is less than the index of refraction of the semiconductor, ultraviolet radiation detector to IR radiation; the index of refraction of the semiconductor, ultraviolet radiation detector to IR radiation is less than the index of refraction of first infrared anti-reflection layer; and the index of refraction of first infrared anti-reflection layer is less than the index of refraction of the an infrared radiation filter.

In one embodiment, an ultraviolet radiation detector structure disposed over an infrared radiation filter is provided, comprising: a first infrared anti-reflection layer disposed on the infrared radiation filter; a semiconductor, ultraviolet radiation detector disposed over the first infrared anti-reflection layer; a second infrared anti-reflection layer disposed on the semiconductor, ultraviolet radiation detector.

In one embodiment, a Schottky contact metal is disposed between the first infrared anti-reflection layer and the semiconductor, ultraviolet radiation detector.

In one embodiment, the semiconductor, ultraviolet radiation detector is in Schottky contact with the Schottky contact metal.

In one embodiment, the first infrared anti-reflection layer reflects ultraviolet energy passing through from the semiconductor, ultraviolet radiation detector back to the semiconductor, ultraviolet radiation detector.

In one embodiment, the semiconductor, ultraviolet radiation detector has a thickness in a range of 0.25 to 2 microns.

In one embodiment, the semiconductor, ultraviolet radiation detector is CdS.

In one embodiment, the semiconductor, ultraviolet radiation detector is CdSe.

In one embodiment the semiconductor, ultraviolet radiation detector is CdTe.

With such structure, the ultraviolet radiation detector is embedded within a pair of IR anti-reflection layers wherein the first infrared anti-reflection layer reflects ultraviolet energy passing through from the semiconductor, ultraviolet radiation detector back to the semiconductor, ultraviolet radiation detector material.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIGS. 2A, 2B and 2C are more detailed, cross-sectional, top plan and bottom plan views, respectively, the cross section of FIG. 2A being taken along lines 2A-2A in FIGS. 2B and 2C, of a UV radiation detector adapted for use in a dual band Ultraviolet (UV) and Infrared (IR) radiation detector according to the disclosure;

FIGS. 3A, 3B and 3C through FIGS. 13A, 13B and 13C are cross sectional, top plan and bottom plan views, respectively of the UV radiation detector of FIGS. 2A, 2B and 2C shown in FIGS. 2A, 2B and 2C at various steps in the fabrication of such UV radiation detector according to the disclosure; with FIG. 11D showing diagrammatically apparatus to form CdS in Schottky contact with a Schottky contact metal layer during one step in fabrication.

Like reference symbols in the various drawings indicate like elements.

DETAILED DESCRIPTION

Figure 2:
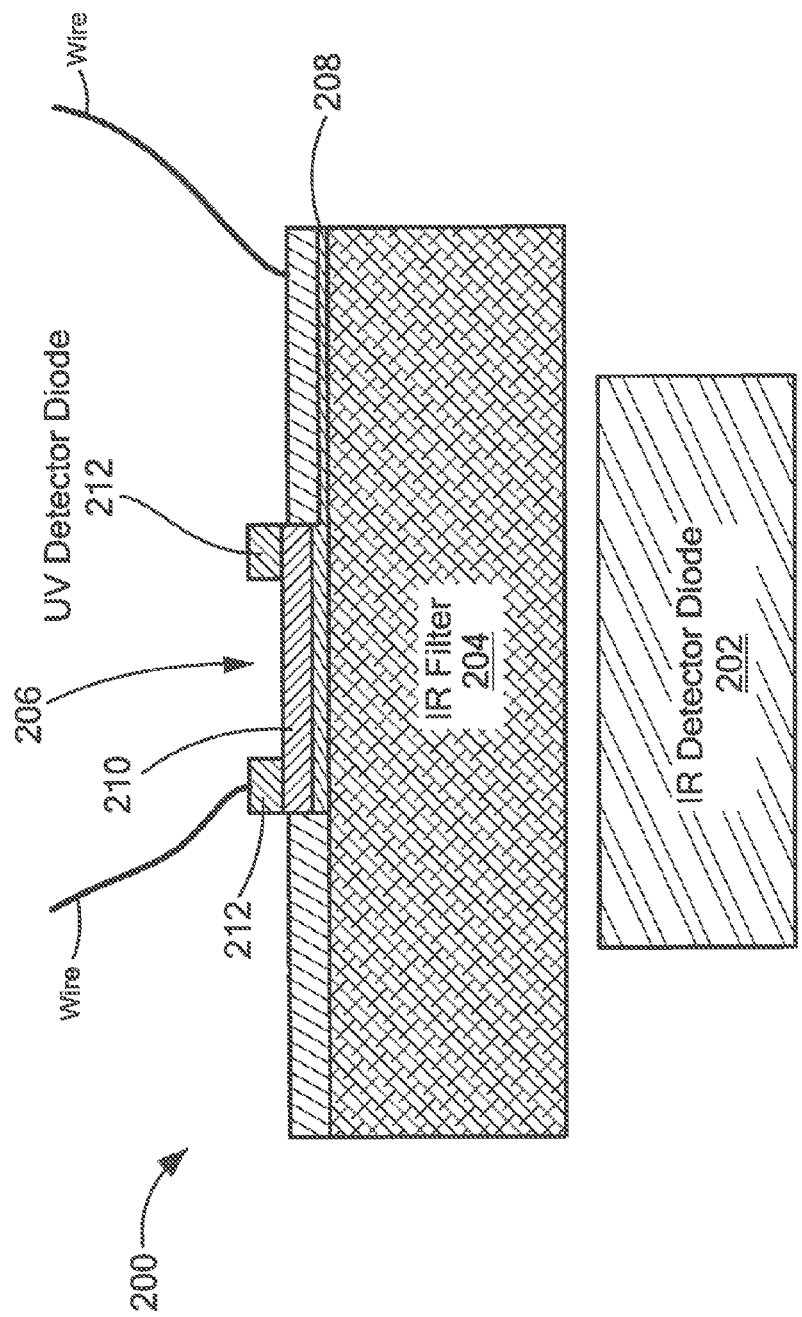
FIG. 2 is a simplified, diagrammatical sketch of a cross section of a dual band UV and Infrared (IR) radiation detector according to the disclosure.

Referring now to FIG. 2, a diagrammatical sketch of a dual band infrared and ultraviolet radiation detector 200 is shown having: an infrared (IR) radiation detector 202; an infrared radiation filter 204, disposed over infrared radiation detector 202, the infrared radiation filter 204 being transparent to infrared radiation band and absorptive to radiation adjacent to the infrared radiation band; and an ultraviolet (UV) radiation detector 206 disposed over the infrared filter 204. The ultraviolet radiation detector 206 includes: a Schottky contact metal layer 208 on an upper surface of the infrared radiation filter 204; a layer 210 of, in this example, a the semiconductor, ultraviolet radiation detector material, here, in this example, Cadmium Sulfide (CdS) disposed directly on, and forming a Schottky contact with, the metal layer 208; and an ohmic contact metal 212 in ohmic contact with another portion of the CdS layer 210. It should be understood that the semiconductor, ultraviolet radiation detector material may be CdTe or CdSe, for example.

Figure 2A:
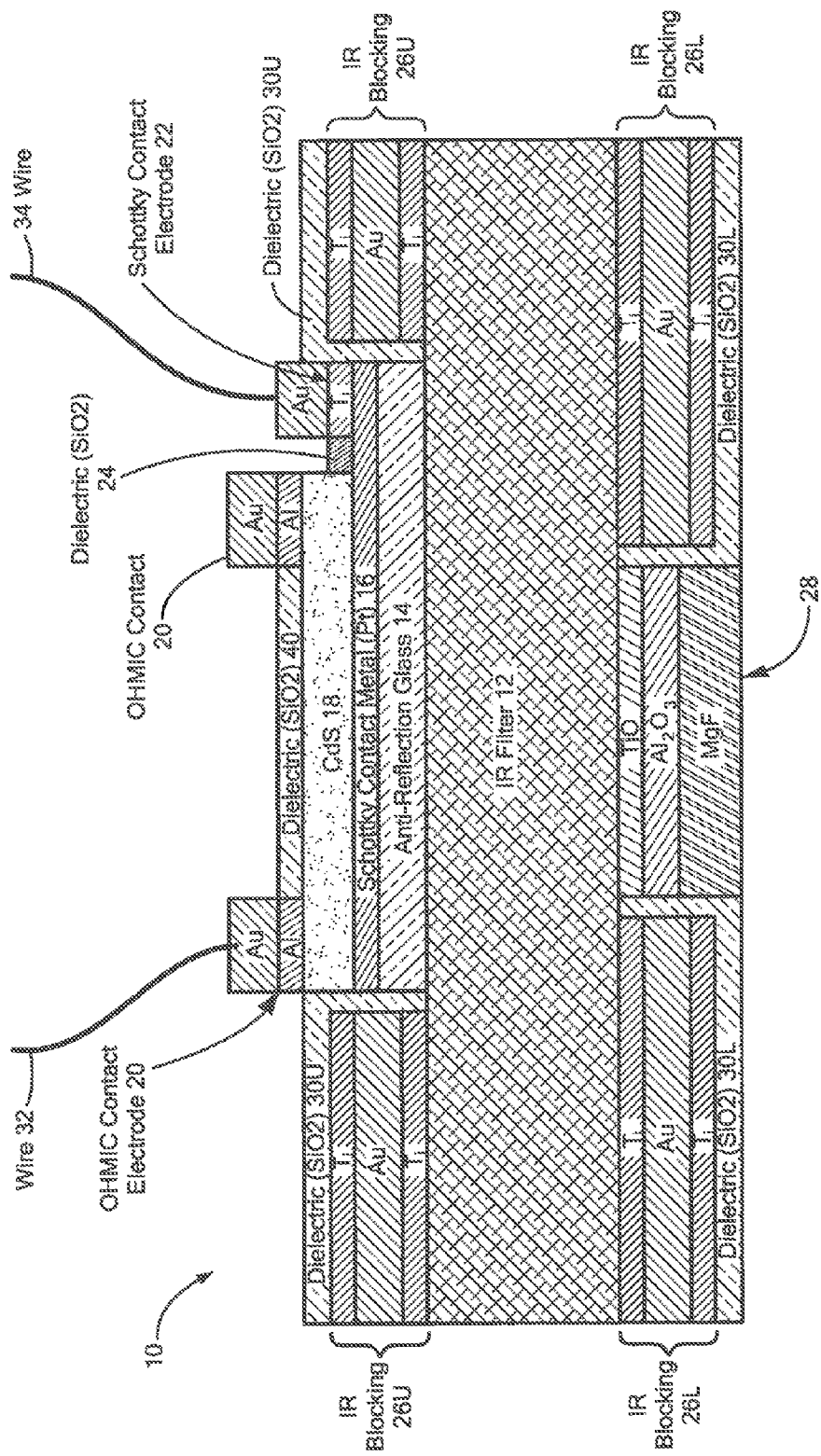

Radiation in the ultraviolet is intercepted and detected by the ultraviolet radiation detector 206 while infrared radiation passing through the ultraviolet radiation detector 206 and through the infrared filter 204 is detected by the infrared detector 202. The details of the infrared (IR) radiation detector 202; an infrared radiation filter 204 will be described in more detail below and are indicated in FIGS. 2A, 2B and 2C as a UV detector 10.

More particularly, referring to FIGS. 2A, 2B and 2C, the UV detector 10 is shown in more detail and is fabricated in accordance with a process described below in connection with FIGS. 3A, 3B and 3C through FIGS. 14A, 14B and 14C. Here, an infrared IR Filter 12, here silicon, is used to also provide a substrate for formation of the detector 10. The detector 10 has an IR radiation anti-reflection coated glass layer 14 supported by the IR Filter 12; a Schottky contact metal 16, here platinum (Pt), here having a thickness in a range (5-50 nm), disposed on the glass layer 14; a semiconductor, UV radiation detector 18, for example CdS or Cadmium Selenide (CdSe), or CdTe, for example), here, in this example CdS layer 18 having a thickness in the order of 0.25 to 2 micron, is in Schottky contact with the Schottky contact metal 16; an ohmic contact electrode 20, here a stack of Gold/Aluminum (Au)/Al, in ohmic contact with the CdS layer 18; an Schottky contact electrode 22, here Titanium (Ti) with Au on top, the Ti being in electrically connected to the Schottky contact metal 16 and electrically insulated from the CdS layer 18 by a dielectric, $SiO_2$ layer 24. Also included are upper and lower IR blocking layers 26U, 26L and IR anti-reflection layers 28, here a stack of TitaniumOxide (TiO)/Aluminum Oxide ($Al_2O_3$)/Magnesium Fluoride (MgF). Dielectric passivation layers 30U, 30L, here silicon dioxide ($SiO_2$) are provided, as shown. An IR radiation anti-reflection dielectric layer 40, here for example, silicon dioxide ($SiO_2$) is disposed on the CdS layer 18. The index of refraction of the IR radiation anti-reflection dielectric layer 40 to IR radiation is less than the index of refraction of the semiconductor, UV radiation detector 18 to IR radiation; the index of refraction of the semiconductor, UV radiation detector 18 to IR radiation is less than the index of refraction of the glass layer 14 to IR radiation; and the index of refraction of glass layer 14 to IR radiation is less than the index of refraction of the an infrared IR Filter 12.

Figure 1:
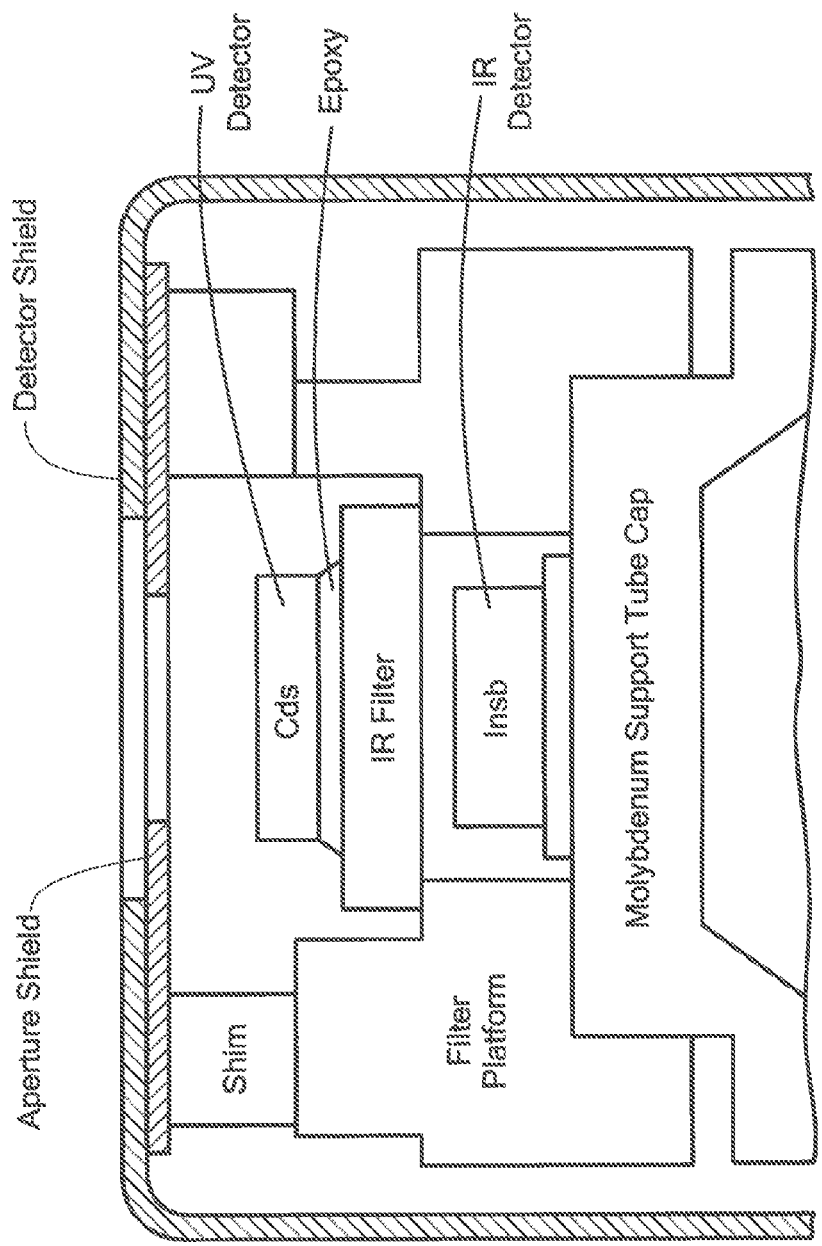
FIG. 1 is a diagrammatical sketch of a cross section of a dual band UV and Infrared (IR) radiation detector according to the PRIOR ART.

Thus, incident radiation passes onto the upper, surface of the structure with the UV portion of the radiation being detected by the UV detector 10 and the IR radiation passing out of the central portion of the structure to the infrared radiation detector 202 (FIG. 1) Wires 32, 34 are electrically connected to the ohmic contact electrode 20 and the Schottky contact electrode 22, respectively, as shown.

Figure 3A:
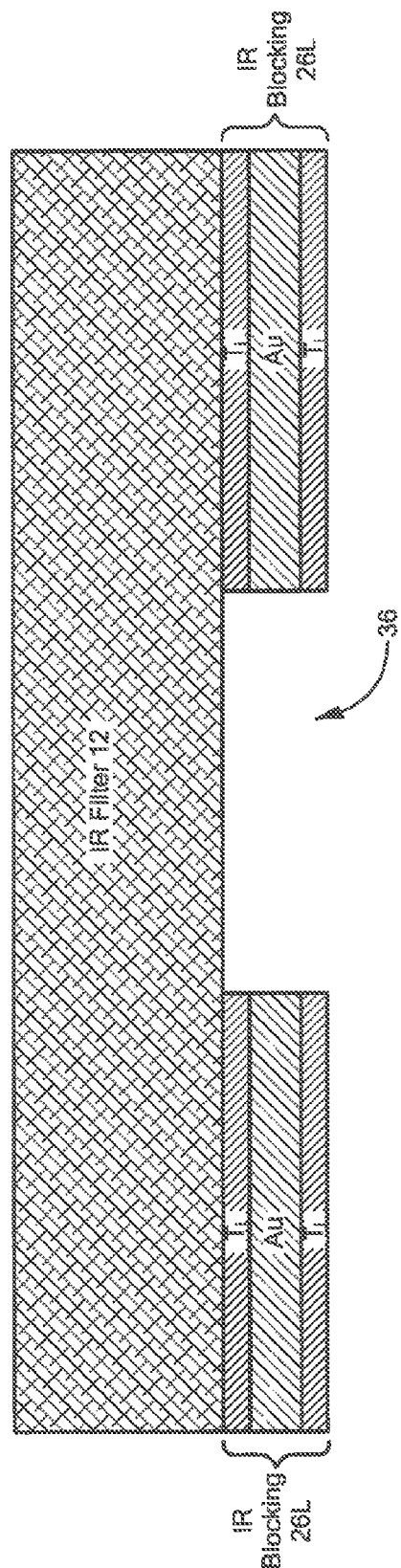
Figure 3C:
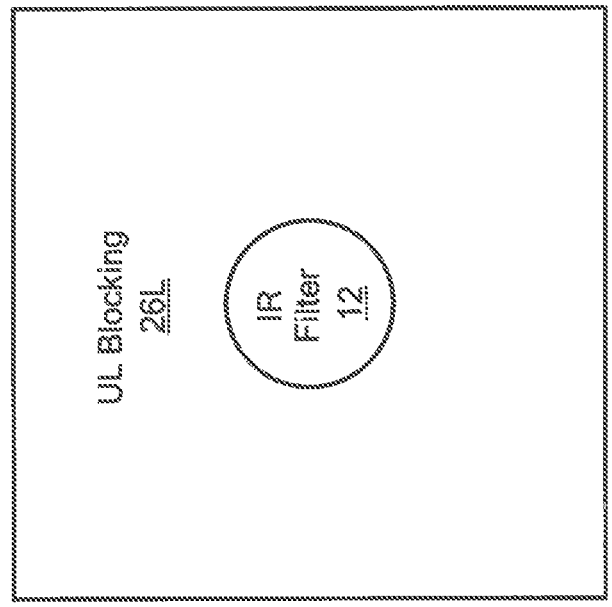
Figure 3B:
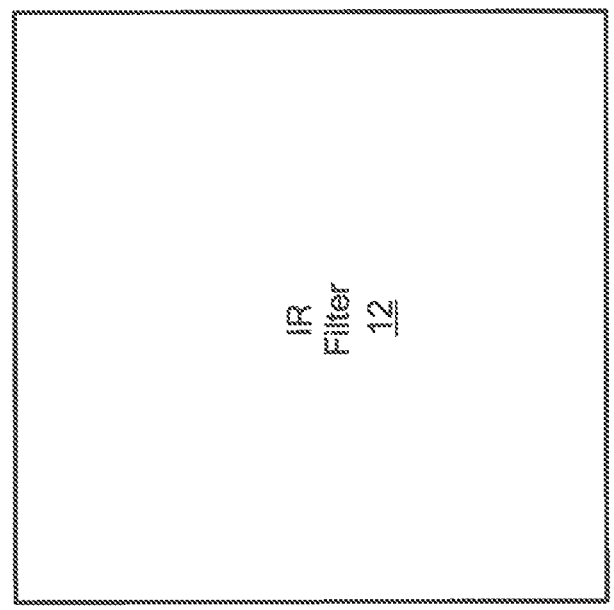

Referring now to FIGS. 3A, 3B and 3C through FIGS. 14A, 14B and 14C, the top and bottom surfaces of the silicon IR Filter 12 is prepared by mechanical polishing and passivation, here for example by immersion in a $HF/NH_4F$ bath. The bottom surface of the an infrared (IR) filter 12, here for example, a single crystal substrate, here for example, silicon, has formed, using any conventional photolithographic-etching process, on the bottom surface thereof the lower UV blocking layer 26L, here of a stack of titanium (Ti)/gold (Au)/Ti with a central, aperture 36 therein exposing a central, bottom surface portion of the IR filter 12, as shown in FIG. 3C.

Figure 4A:
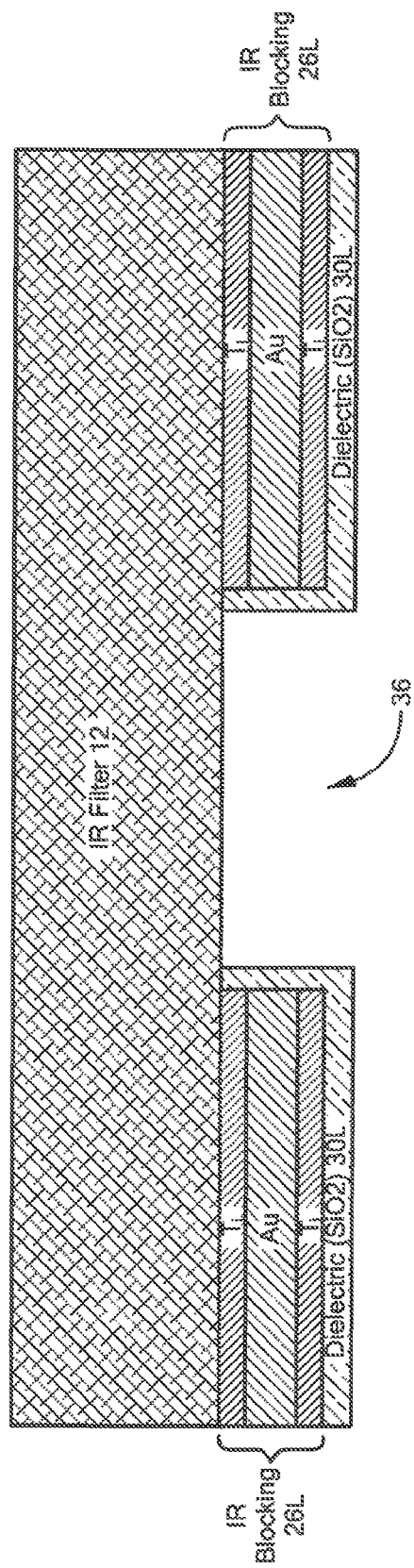
Figure 4C:
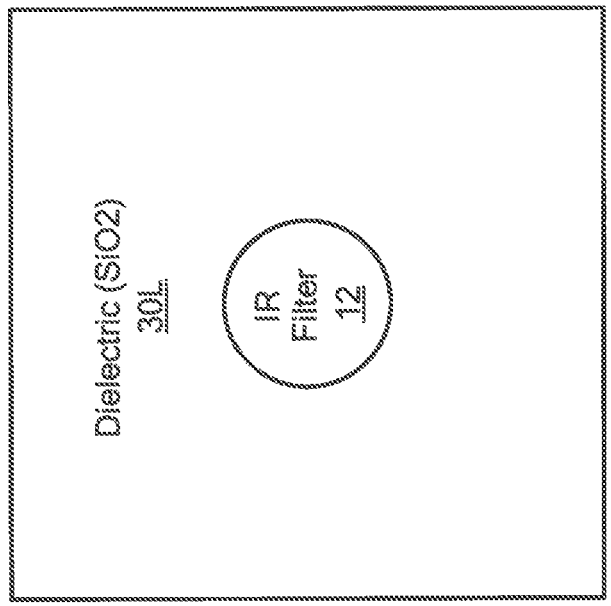
Figure 4B:
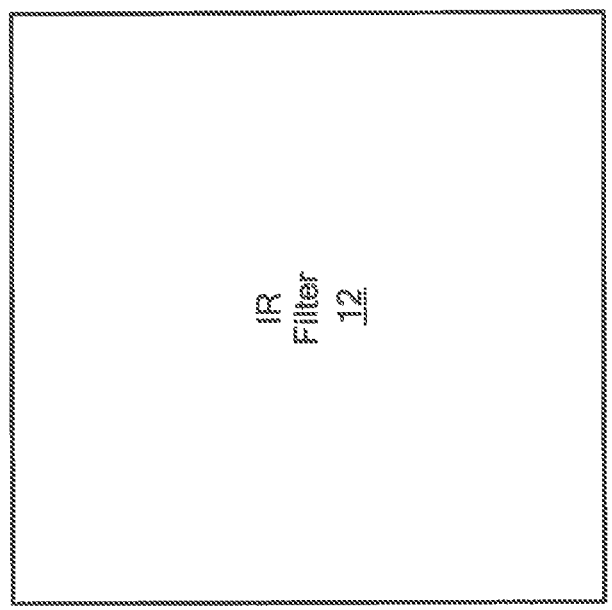

Next, the dielectric layer 30L, here silicon dioxide ($SiO_2$) is formed over the lower IR blocking layer 26L and onto the portion of the silicon IR Filter 12 exposed by the aperture 36. Next, the portion of the dielectric layer 30L on the exposed, central portion of the IR Filter 12 is removed using any conventional photolithographic-etching process thereby re-exposing the central portion of the bottom of the IR Filter 12, as shown in FIGS. 4A, 4B and 4C.

Figure 5A:
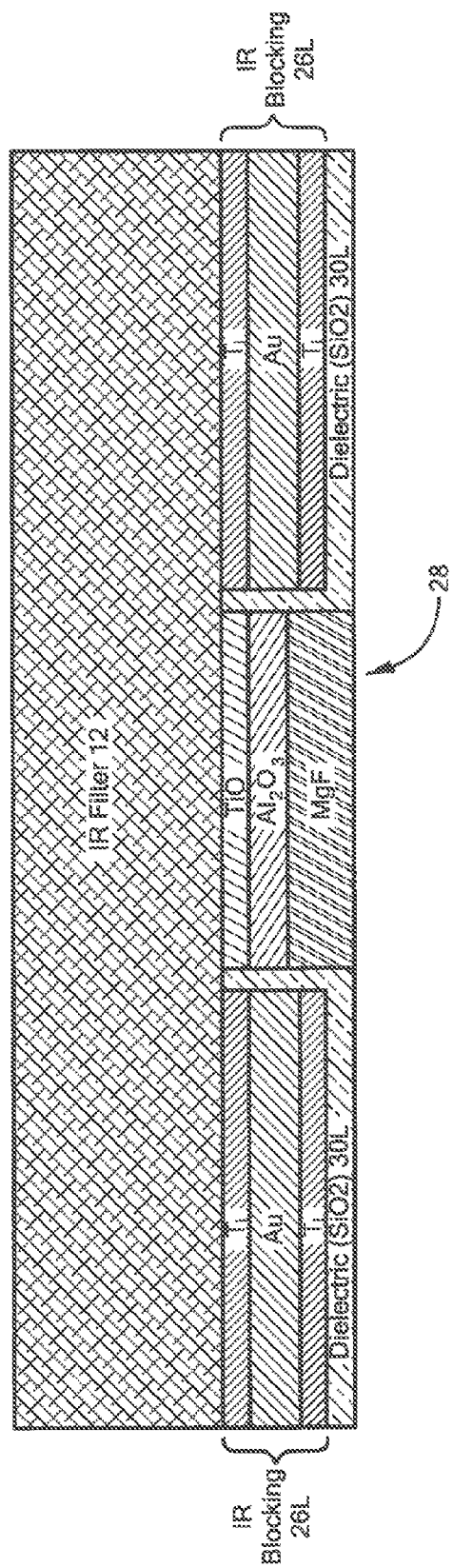
Figure 5C:
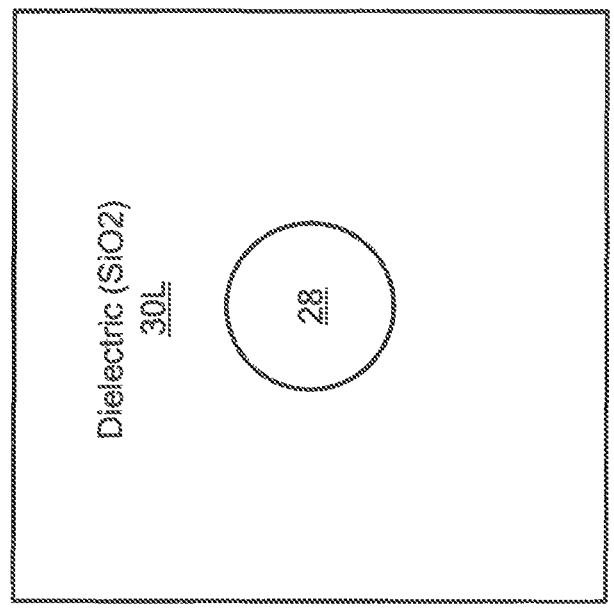
Figure 5B:
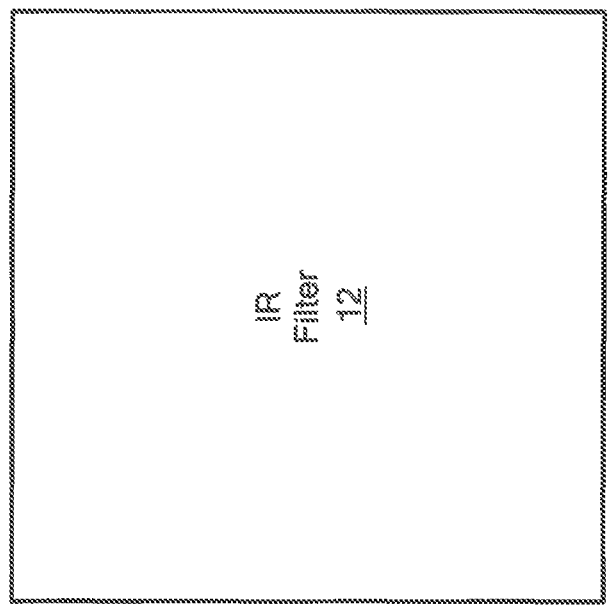

Next, a sequence of three layers of TiO, $Al_2O_3$ and MgF making up IR anti-reflection layer 28 (FIG. 2A) is formed: first a layer of Titanium Oxide (TiO); then a layer of aluminum oxide ($Al_2O_3$); then a layer of Magnesium Fluoride (MgF) are deposited over the structure; such sequence of layers being deposited onto the re-exposed portion of the central, bottom of the IR Filter 12 and over the remaining dielectric layer 30L. Conventional photolithographic-etching processing is used to remove the portions of the three layers making up layer 28 disposed over the remaining dielectric layer 30L leaving only the portion of the three layers making up layer 28 disposed on the central portion of the IR Filter 12, as shown in FIGS. 5A, 5B and 5C thereby completing processing of the bottom of the IR Filter 10.

Figure 6A:
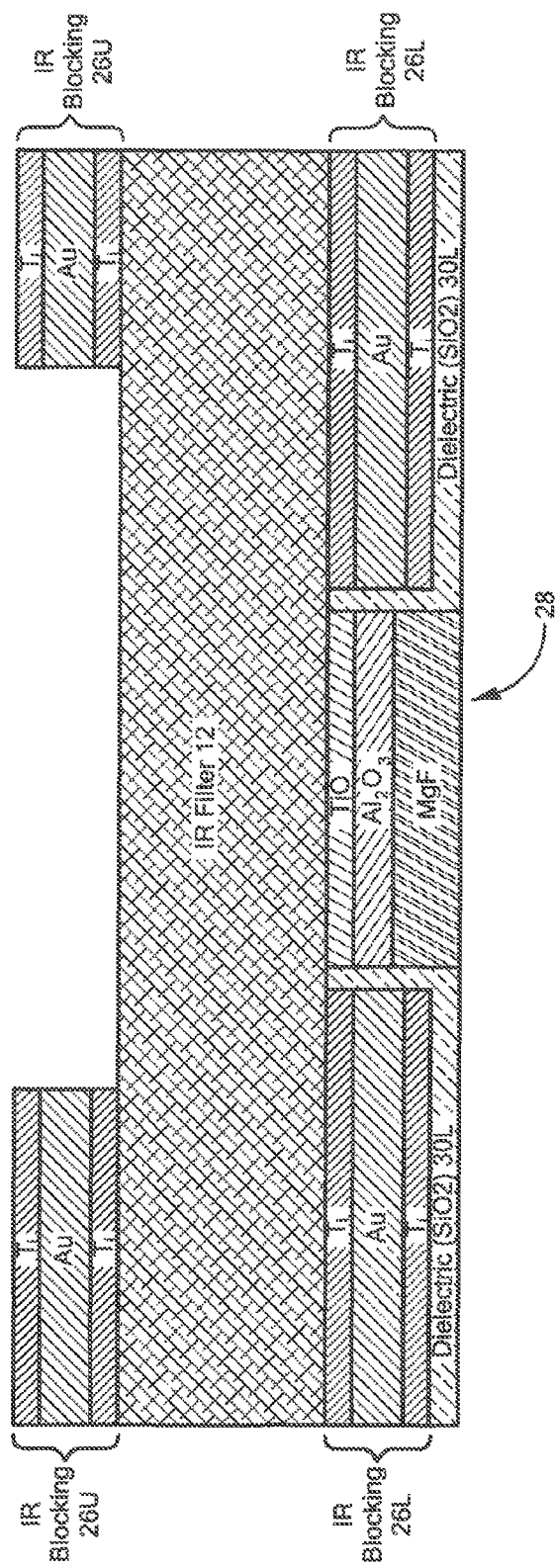
Figure 6C:
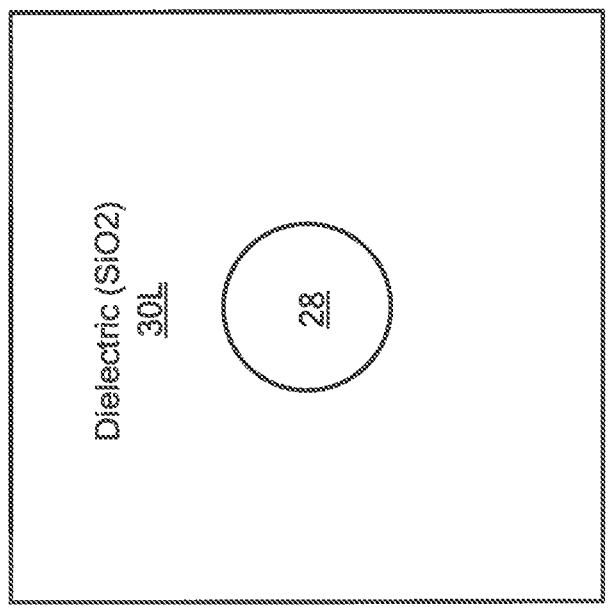
Figure 6B:
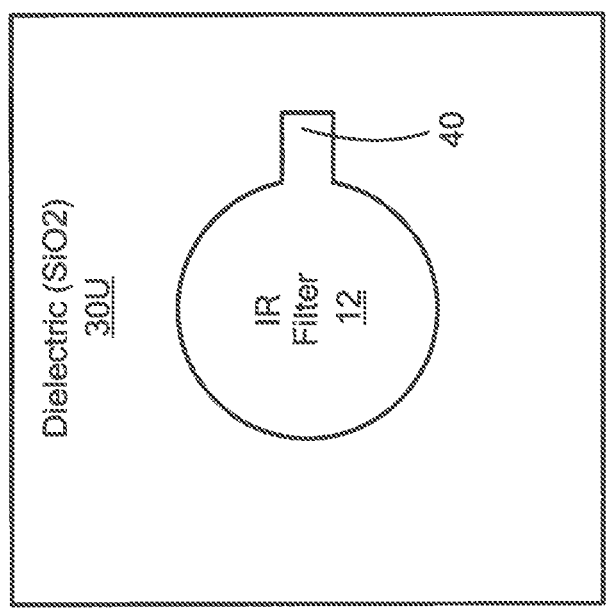

Next, referring to FIGS. 6A, 6B and 6C, the upper IR blocking layers 26U are formed over the upper surface of the IR Filter 12. More particularly, a sequence of metal layers forming an upper IR blocking layer 26U, here Ti/Au/Ti is deposited over the upper surface of the IR Filter 12 and processed using conventional photolithographic-etching process to have a circular, central aperture 38 with a tab 41 extending laterally from the outer periphery of the circular, central aperture 38 formed in the upper IR blocking layers 26U, as shown more clearly in FIG. 5B. It is noted that the aperture 38 is larger in diameter than the aperture 36 shown FIGS. 3A, 3B and 3C.

Figure 7A:
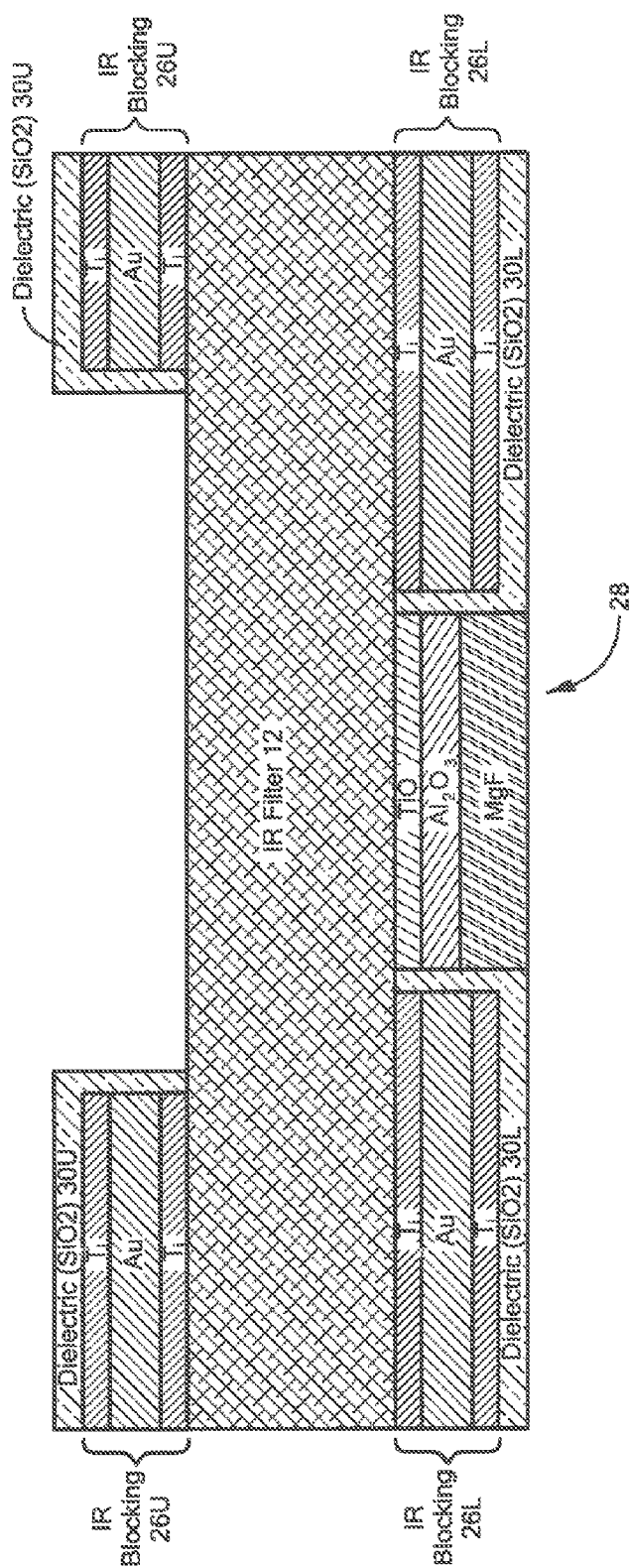
Figure 7B:
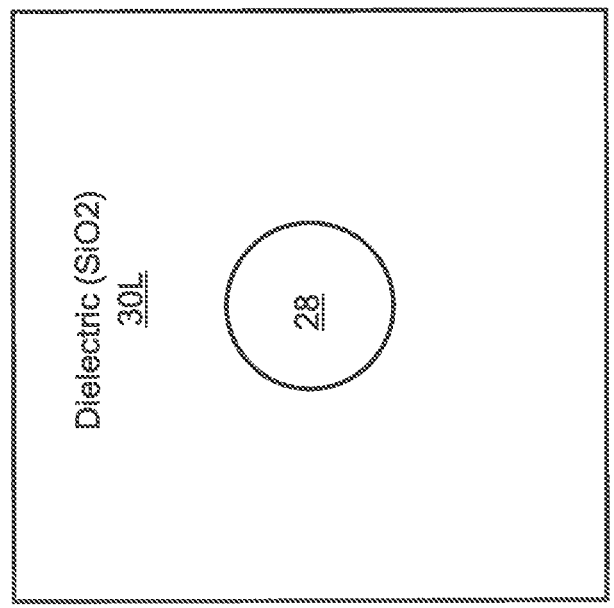
Figure 7C:
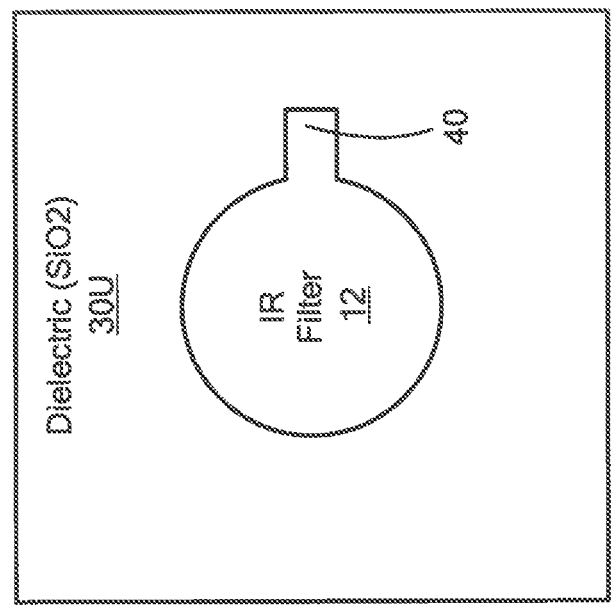

Next, the passive dielectric layer 30U, here silicon dioxide ($SiO_2$), is formed over the upper blocking layer 26U and onto the central, upper surface portion of the silicon IR Filter 12 exposed by the aperture 38 and the tab 41. Next, the portion of the dielectric layer 30U on the exposed central, upper surface portion of the IR Filter 12 is removed using any conventional photolithographic-etching process thereby re-exposing a central, upper surface portion of the IR Filter 12, as shown in FIGS. 7A, 7B and 7C including from the portion provided by the tab 41 as shown more clearly in FIG. 7B.

Figure 8A:
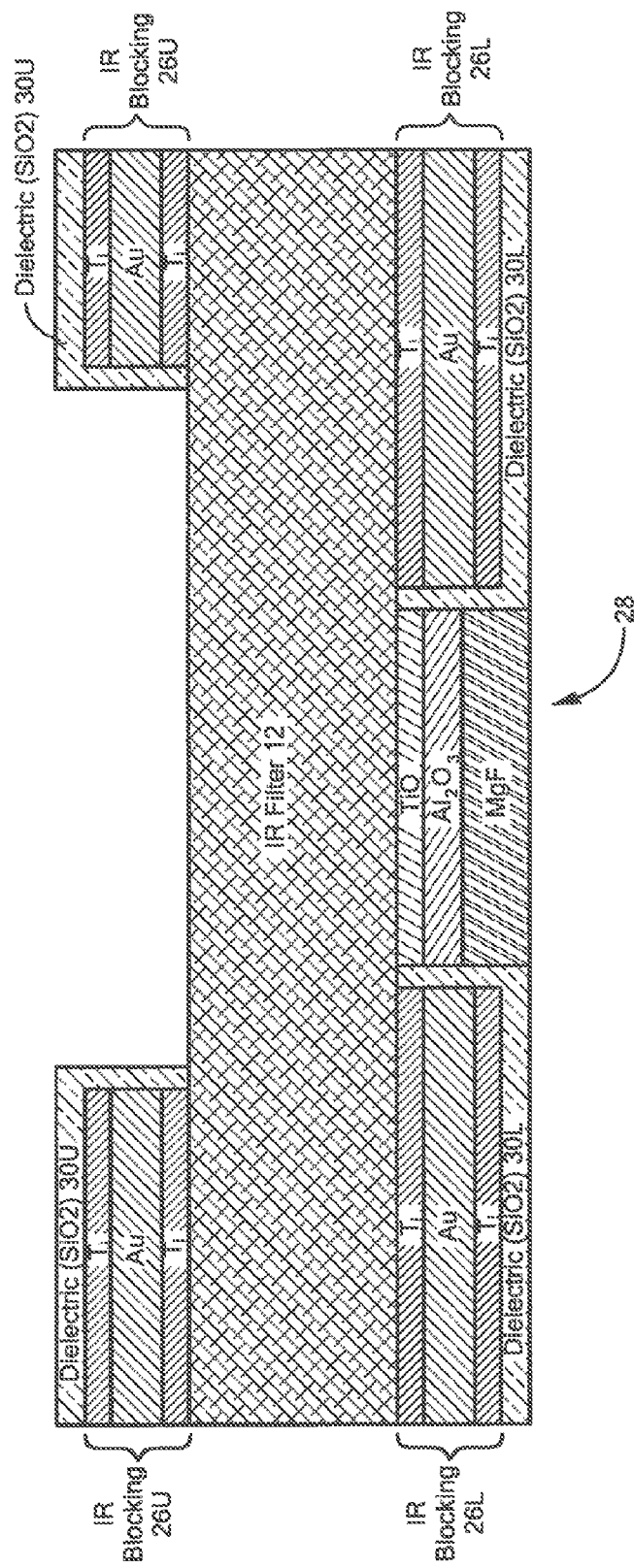
Figure 8C:
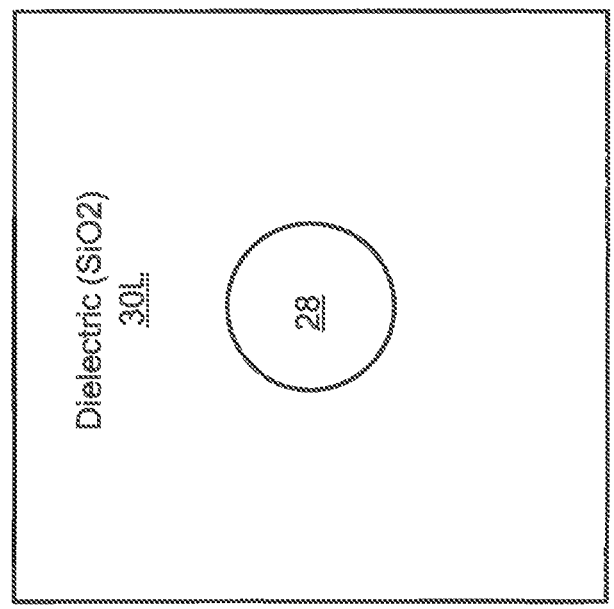
Figure 8B:
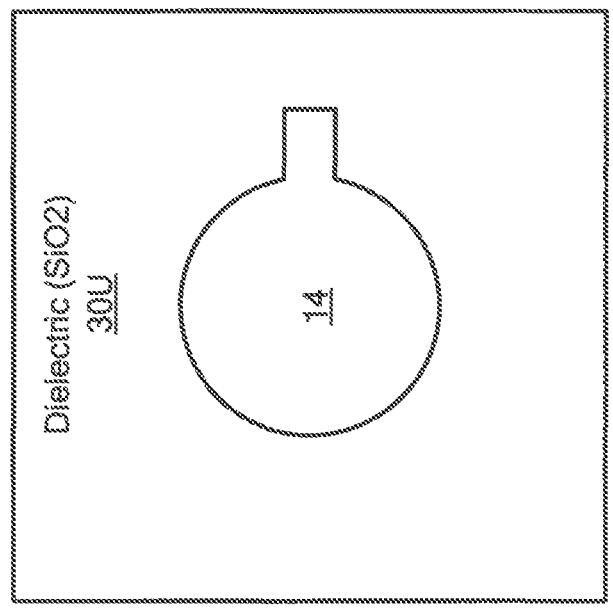

Next, referring to FIGS. 8A, 8B and 8C the anti-reflection layer of glass 14, here IRG 23 glass having a thickness in this example, of approximately 0.45 microns, is formed using conventional chemical vapor deposition directly on the portion of the upper, central surface portion of the IR Filter 12 exposed by the aperture 38 and the tab 41 provided region, as shown in FIGS. 8A, 8B and 8C. As noted above, the glass layer 14 has a circular surface portion 42 with an extending tab region 44, as shown more clearly in FIG. 8B.

Figure 9A:
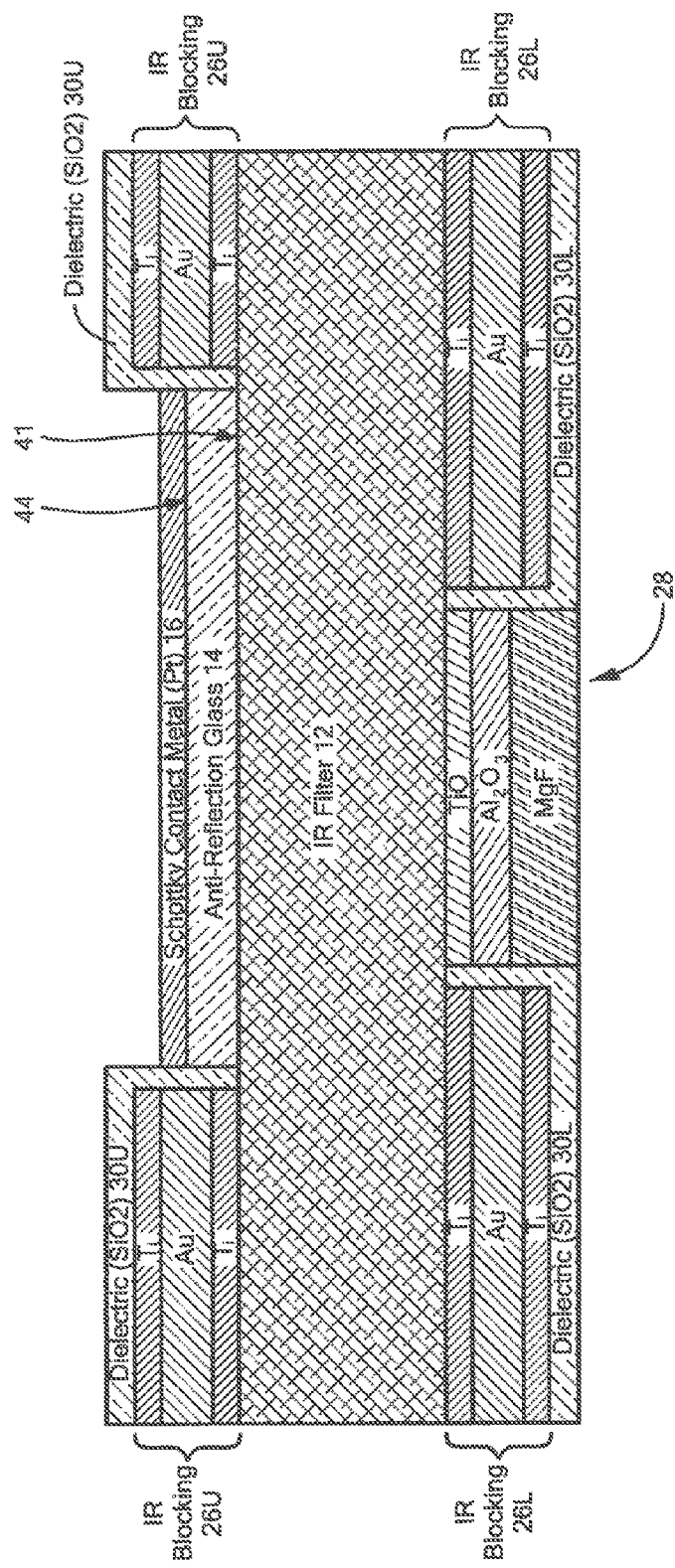
Figure 9C:
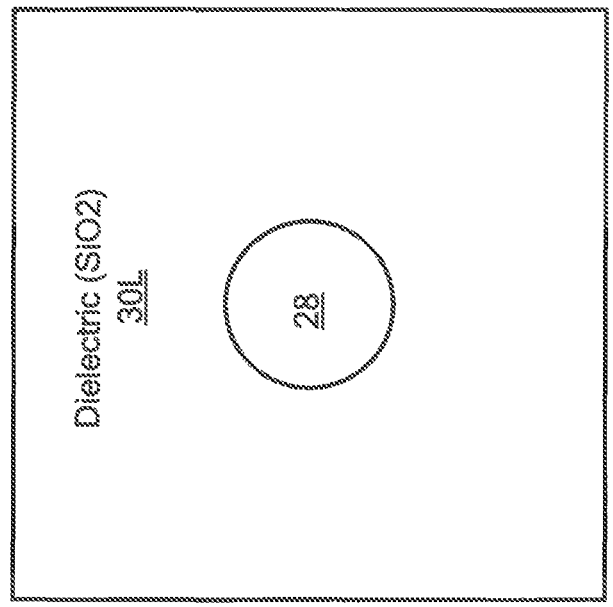
Figure 9B:
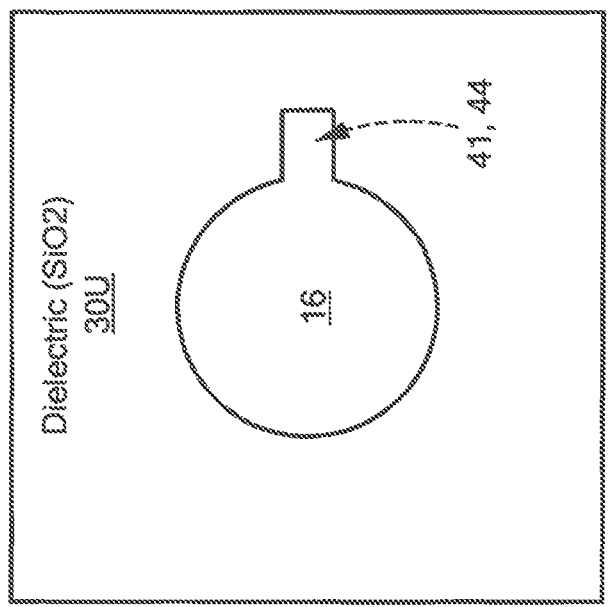

Next, referring to FIGS. 9A, 9B and 9C, the Schottky contact metal 16, here for example, platinum (or other suitable metals or alloys) having a thickness in the example, approximately 5 to 50 nm, preferably 15 nm), is formed. More particularly, the dielectric layer 30L on the upper surface of the structure is masked by a mask, not shown, while the mask exposes the upper surface of the glass layer 14. The Schottky contact metal 16 is sputter deposited over the masked upper surface of the structure onto thus onto the upper surface region 42 of the glass layer 14 including the tab region 44 of the glass layer 14, as shown more clearly in FIG. 9B.

Figure 10A:
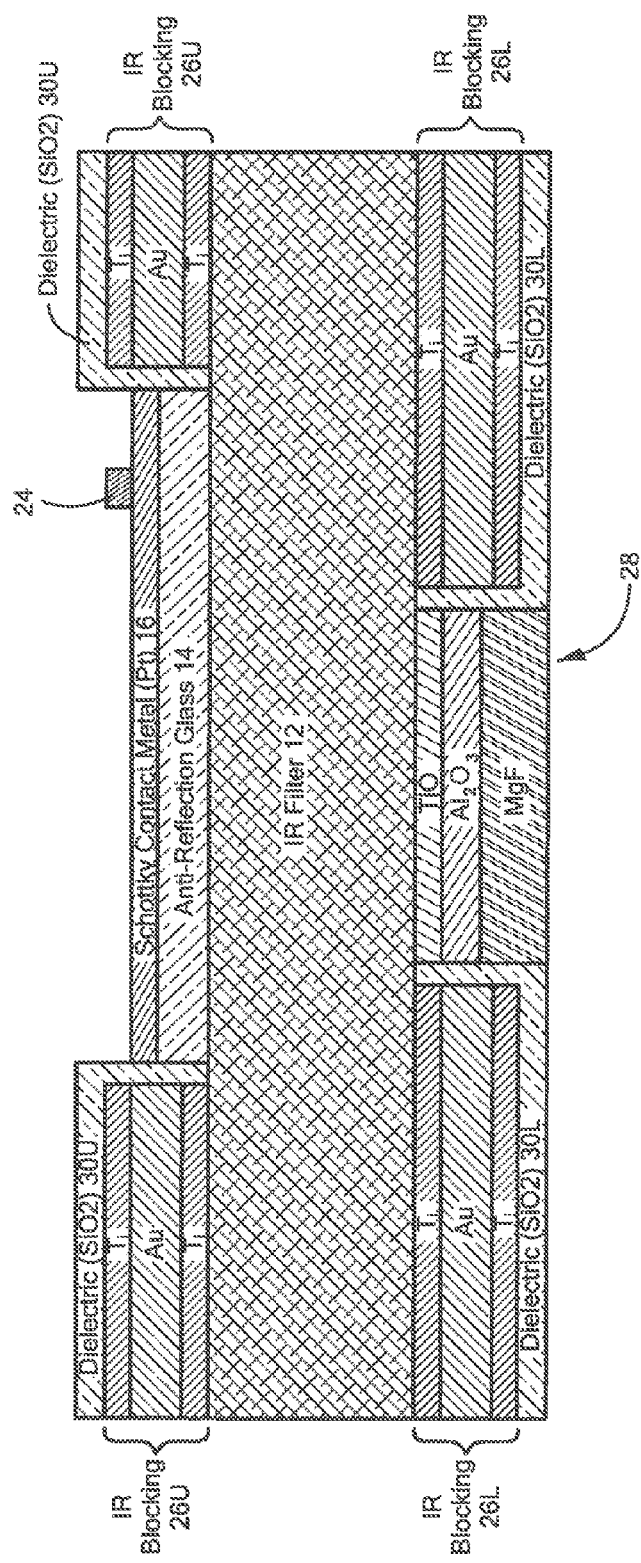
Figure 10C:
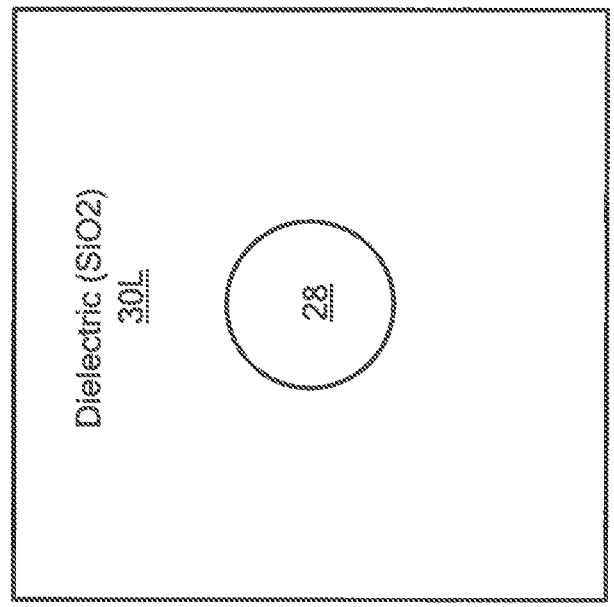
Figure 10B:
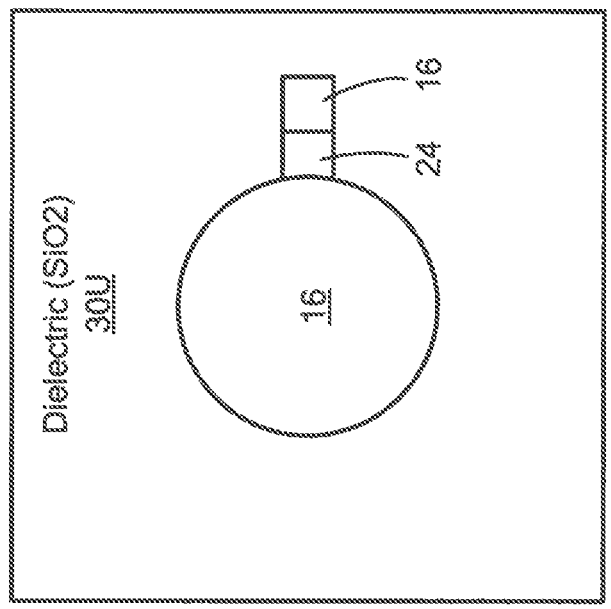

Next, referring to FIGS. 10A, 10B and 10C, the dielectric layer 24 of, here silicon dioxide, is deposited over the structure and patterned to cover dielectric layer 30U coating the upper IR blocking layers 26U and to expose a pad-like, island region 46 of Schottky contact metal 16, as shown more clearly in FIG. 10B. Thus, the pad-like, island region 46 of Schottky contact metal 16 is laterally separated from the central region of Schottky contact metal 16 by portions of the dielectric layer 24, as shown more clearly in FIG. 10B and FIG. 2A.

Figure 11A:
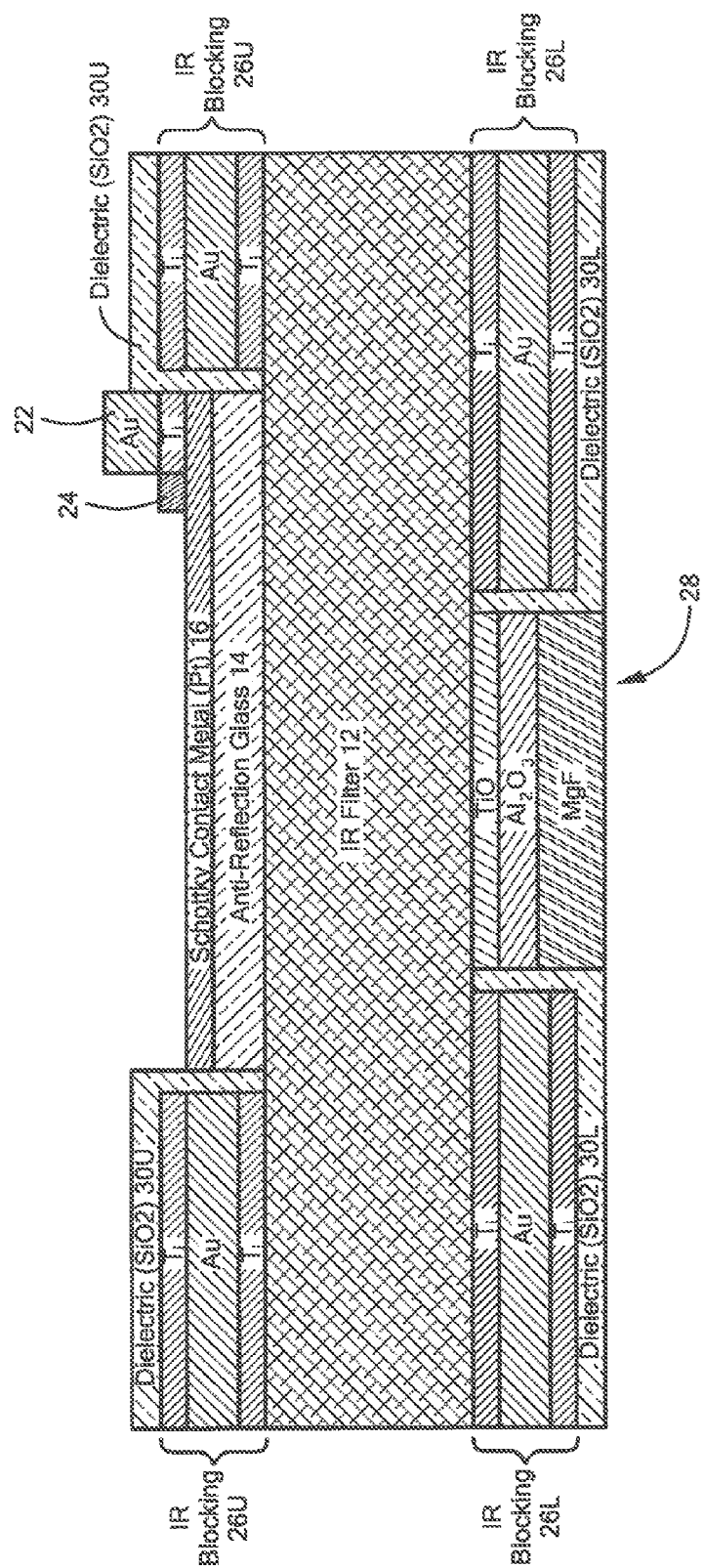
Figure 11C:
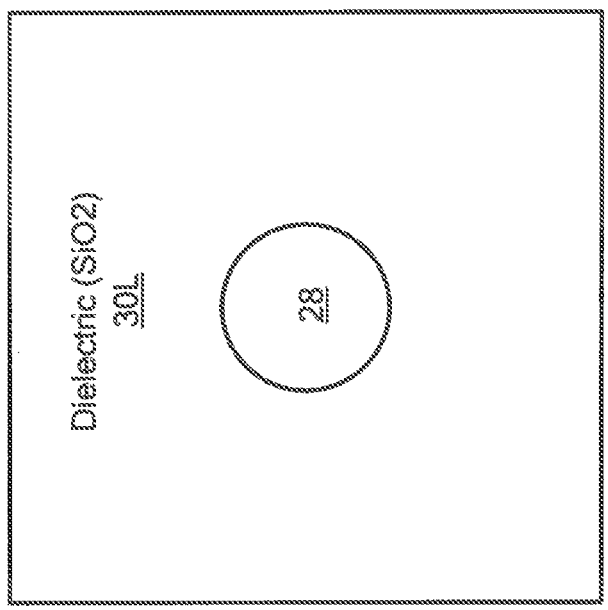
Figure 11B:
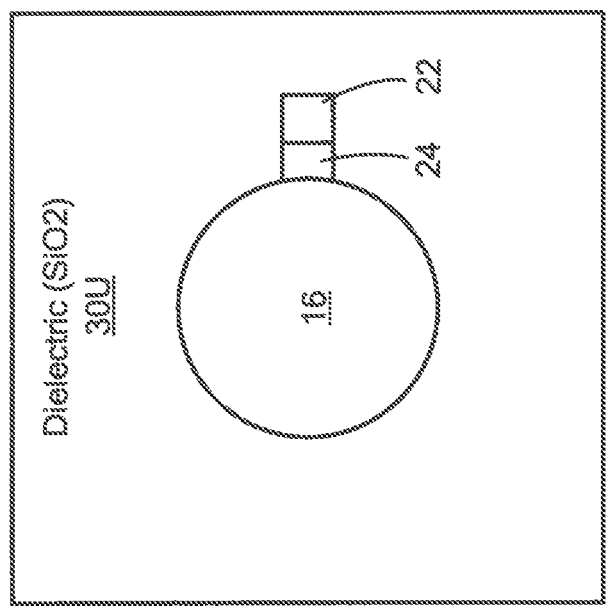

Next, referring to FIGS. 11A, 11B and 11C, the Schottky contact electrode 22 is formed as a sequence of two layers; a Ti/Au stack is formed on the pad-like, island region 46 of Schottky contact metal 16 using conventional photolithographic-etching processing to form an electrical connection to Schottky contact metal 16, as shown in FIG. 11A. It is noted that because the thickness of the Schottky contact metal 16 is very thin, here for example in a range of approximately 5 to 50 nm, preferably 15 nm, the Schottky contact metal 16 is transparent to infrared radiation.

Figure 12A:
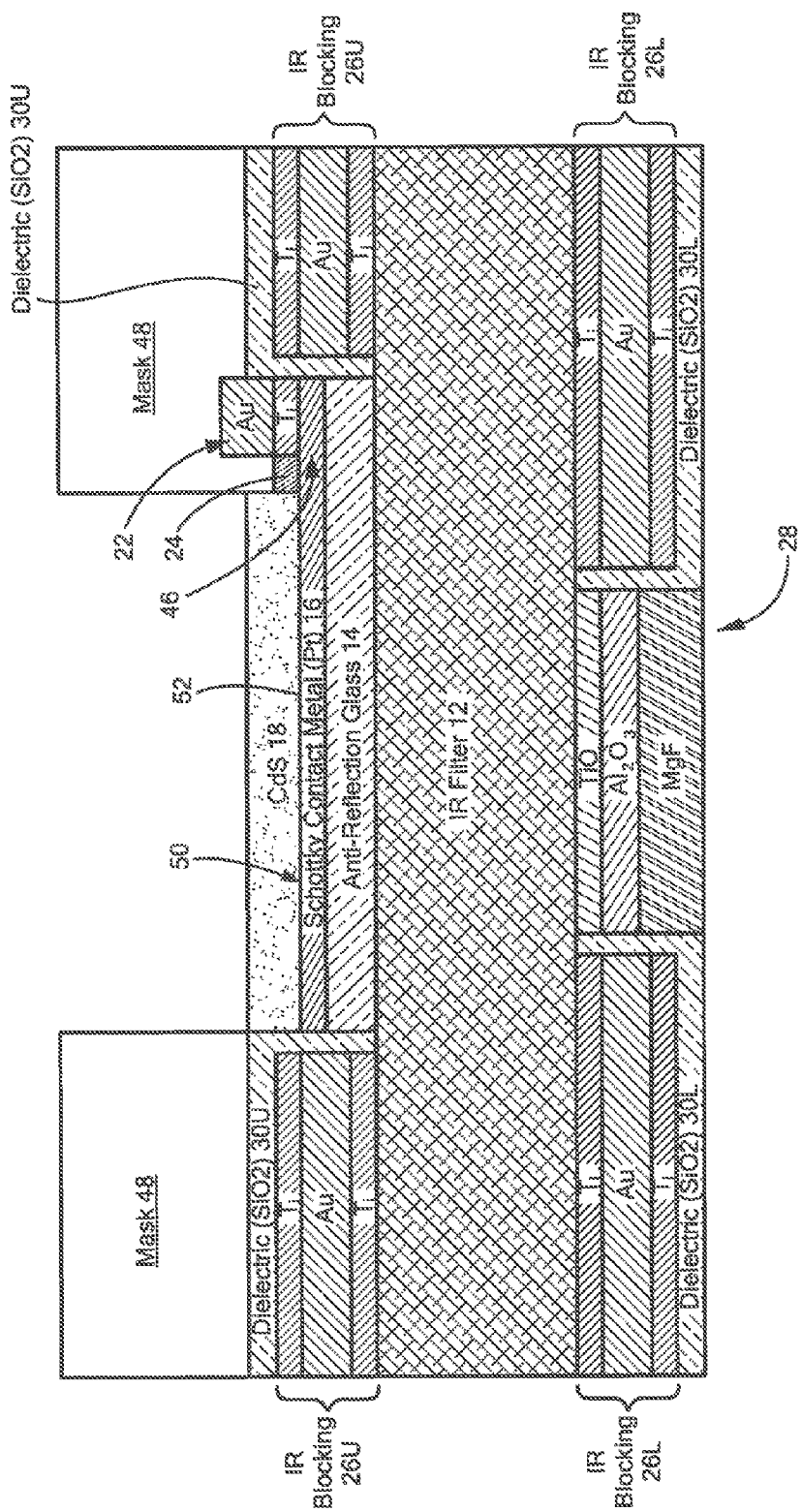
Figure 12A:
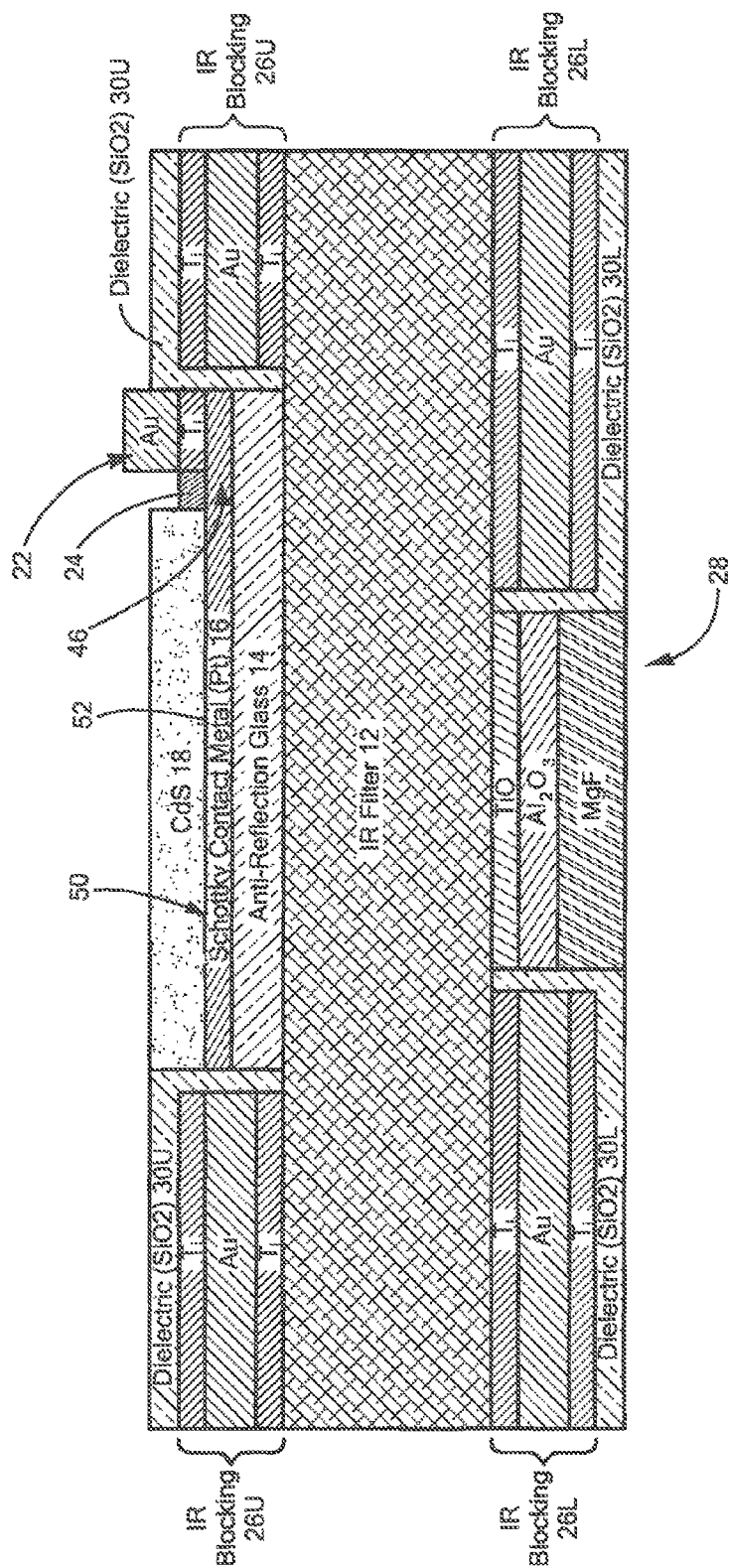
Figure 12C:
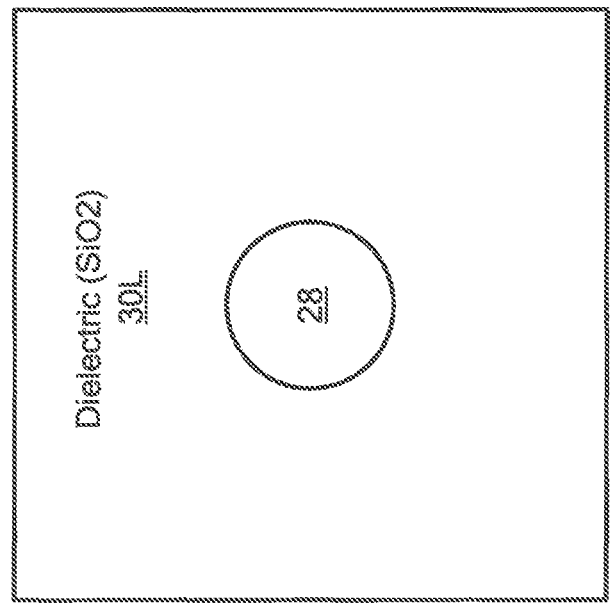
Figure 12B:
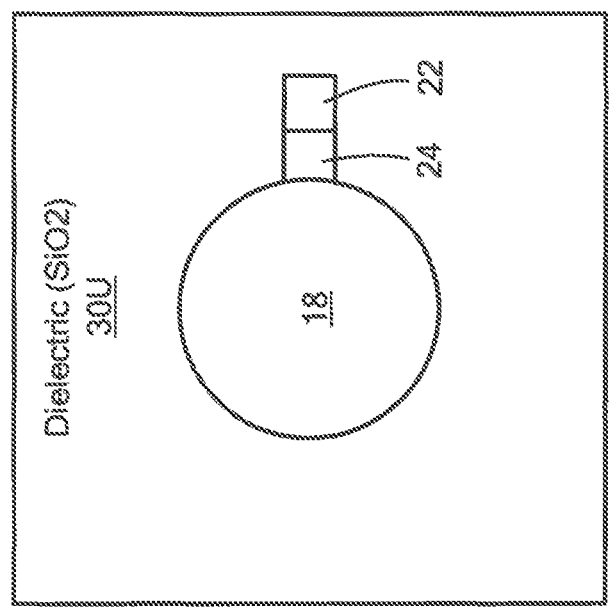

Next, referring to FIGS. 12A, 12A', 12B and 12C, a photomask 48 is applied to resulting surface. A circular shaped window 50 is projected onto the photomask 48 (FIG. 12A). The photomask 48 is chemically developed and etched leaving an exposed central surface portion 52 of the Schottky contact metal 16; it being noted that the photomask 48 remains over the dielectric layer 30U and over the Ti/Au formed on the pad-like, island region 46 of Schottky contact metal 16. A circular shaped layer 18 of CdS is next formed directly onto the exposed central surface portion of the Schottky contact layer 16, here using vapor deposition, producing the structure shown in FIG. 12A. Here, the thickness of the layer 18 of CdS is in the order of one micron, here in this example, 0.4 microns. More particularly, a controlled ratio of Sulfur and Cadmium Sulfide chemically vapor deposited under controlled thermal and pressure conditions in a manner such as described in the above-referenced paper entitled "Rectifying Contacts Under Evaporated CdS" by JOHN A. SCOTT-MONCK ARTHUR J. LEARN, published PROCEEDINGS OF THE IEEE, JANUARY 1968 page 68. As described in more detail in this paper, a high work function metal 16 to provide the Schottky contact metal 16, here platinum is first evaporated on the glass layer 14. A thin layer of sulfur is then deposited on the metal 16. To ensure sticking of the sulfur, the substrate is cooled below room temperature for this deposition step. The thickness is in the order of a few hundred angstroms. Following the sulfur evaporation a small amount of cadmium sulfide is evaporated during subsequent heating. The thickness of the cadmium sulfide can be as small as 30 Angstroms. Details of the CdS source construction and properties are described in R. S. Spriggs and A. J. Learn, "Vapor source for vacuum evaporation of compounds," Rer. Sci. Instr., vol. 37, pp. 1539-1542, November 1966. As the next step, the structure is raised to more appropriate temperatures for deposition of preferentially oriented semiconductor, in this case at least 100 degrees C. forming the CdS layer 18 in Schottky contact with the Schottky contact metal 16.

Figure 11D:
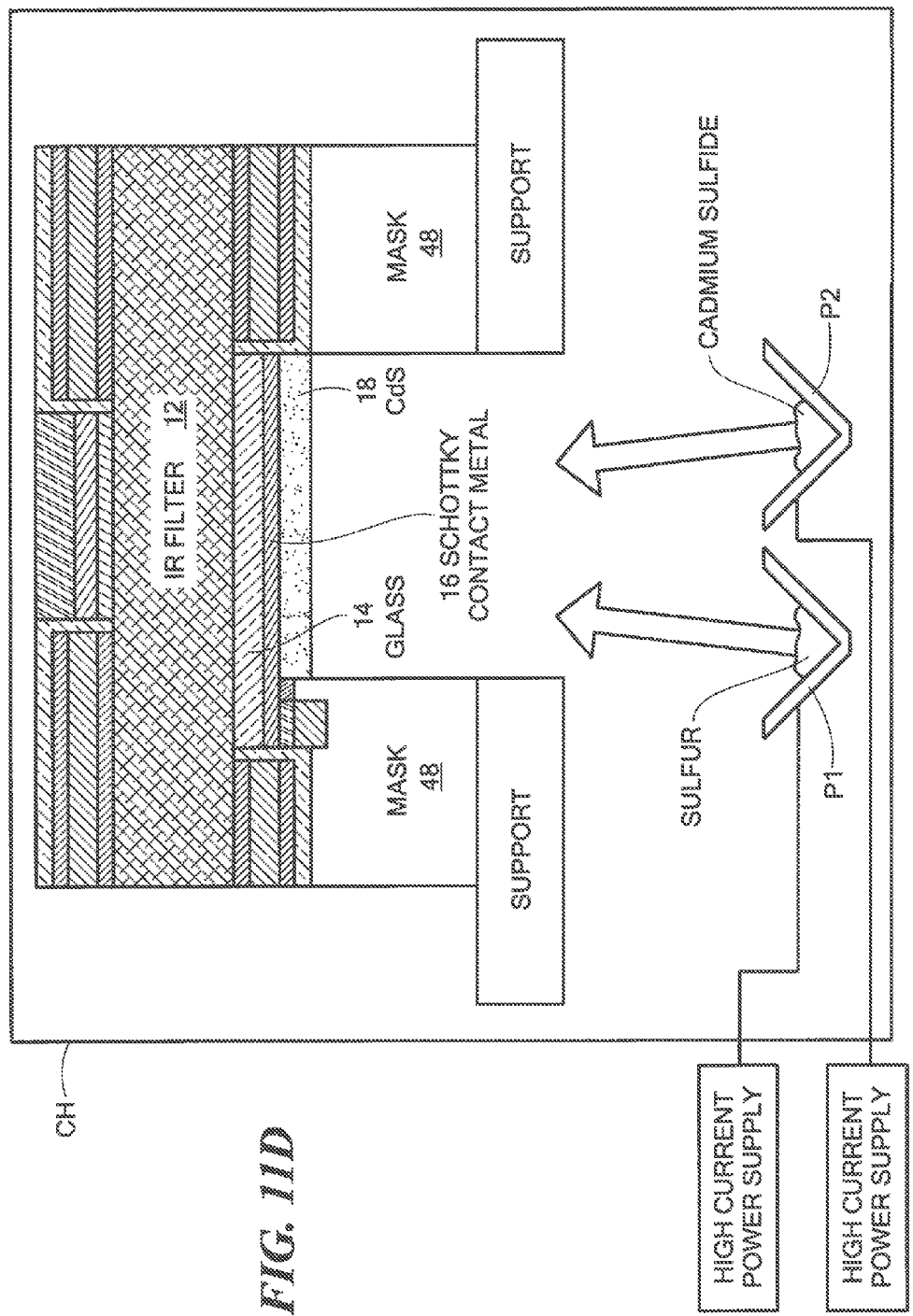

One apparatus to provide the chemical vapor deposition of the Schottky contact metal layer 18 is shown diagrammatically in FIG. 11D with the masked structure of FIG. 12A disposed in a vacuum, evacuated chamber CM mounted upside-down to a support using any conventional support means to expose the portion of the Schottky contact metal 16 where the CdS layer 18 is to be formed. Also included in the chamber CM is a high resistance tough or pot P1 of Sulfur and a high resistance tough or pot P2 of Cadmium Sulfide. The pots P1 and P2 are heated with high current power supplies; first the pot P1 is heated as described in the paper referenced above to evaporate the Sulfur and then the pot P2 is heated as described in the paper referenced above to evaporate the Sulfur. Alternatively, Pot P1 may have Sulfur and pot P2 Cadmium with both pots heated to evaporate the Cadmium Sulfide and Sulfur with the evaporated Cadmium Sulfide and Sulfur being condensed and coming together on the surface of the Schottky contact metal layer 16 where the react to form CdS layer 18 in Schottky contact with the Schottky contact metal layer 16.

Thus, there is no additional, intermediate adhesive type layer between the Schottky contact metal 16 and the CdS layer 18. The bonding between the Schottky contact metal 16 and the CdS layer 18 is by a Van derWaal bonding. It is noted therefore that the layer 18 of CdS is formed by chemical vapor deposition of Cadmium Sulfide and Sulfur. Further, it is noted that the layer of CdS has a c-axis perpendicular to the surface of the layer 18 of CdS. The mask 48 is removed producing the structure shown in FIGS. 12A', 12B and 12C.

Figure 13A:
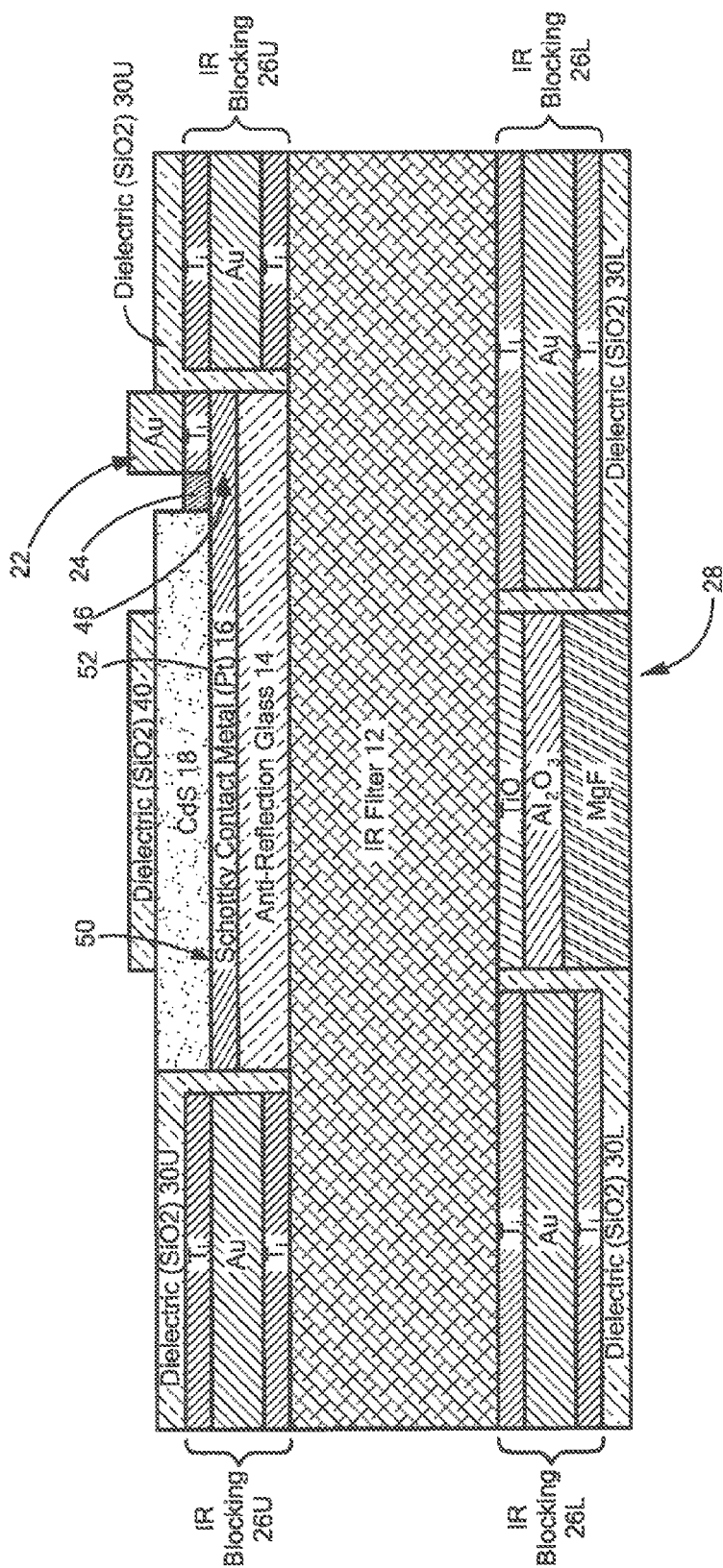
Figure 13C:
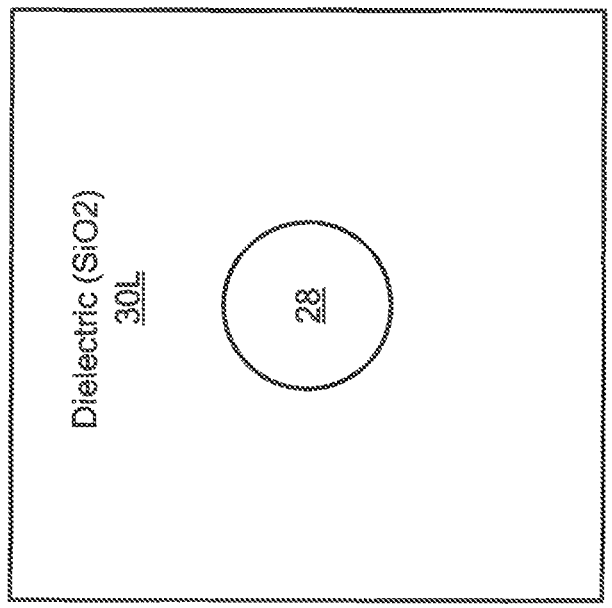
Figure 13B:
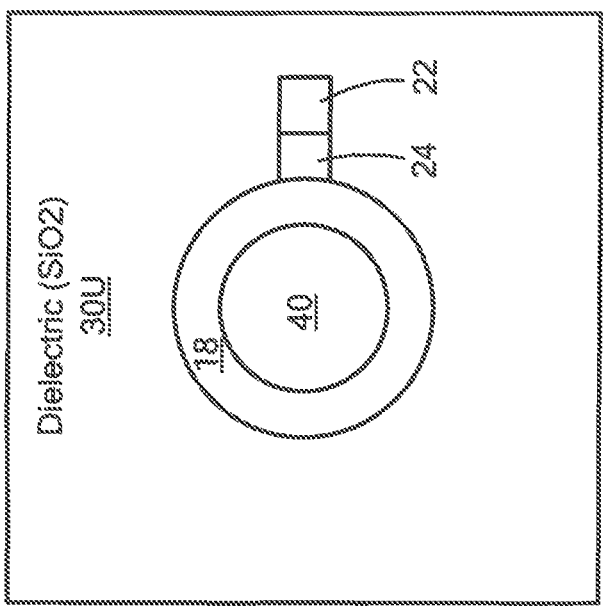

Next, referring to FIGS. 13A, 13B and 13C, a surface protection and IR anti-reflection coating dielectric layer 40, here silicon dioxide, is formed, here by chemical vapor deposition over, and in direct contact with, the inner portion of the CdS layer 18 using conventional photolithographic-etching processing; it being noted that outer portions 32 of the CdS layer 18 are exposed by the dielectric layer 40, producing a ring-shaped exposed portion 32 of the CdS layer 18, as shown more clearly in FIG. 13B.

Next, the Ohmic contact electrode 20 is formed by first forming an adhesion layer of aluminum (or other suitable metals or alloys) sputter deposited onto the exposed ring-shaped portion 32 of the CdS layer followed by a sputtered layer of gold to form a ring-shaped ohmic contact electrode in ohmic contact with the CdS layer 18 as shown in FIGS. 2A, 2B and 2C. Wires 32, 34 are bonded to the ring-shaped ohmic contact electrode 20 and to the Al/Au Schottky contact electrode 22 that make electrical connection to Schottky contact metal 16, as shown in FIGS. 2A, 2B and 2C.

Further in accordance with the disclosed structure, the semiconductor ultraviolet radiation detection material detecting layer 18 becomes an integral component of the IR detector anti-reflection (AR) layer which includes $SiO_2$ layer 40, the semiconductor ultraviolet radiation detection material layer 18, anti-reflection glass 14 in addition to IR anti-reflection layers 28. It is noted that the Schottky contact metal layer 16 is relatively thin, in the range of 20-100 nm, for example. That is, the semiconductor ultraviolet radiation detection material layer 18 is now a functional part of the IR anti-reflection coating provided to the IR detector 202 (FIG. 1) and therefore serves a dual purpose; an anti-reflection coating for the IR detector 202; and detection of the UV energy. Further, when the UV signal reaches the exit interface between the anti-reflection glass 14 and the semiconductor ultraviolet radiation detection material layer 18; because of the refractive index of the glass is greater than the semiconductor ultraviolet radiation detection material, any UV not absorbed in the incident path will be reflected back to the semiconductor ultraviolet radiation detection material layer 18 and be completely absorbed in the semiconductor ultraviolet radiation detection material. Still further, this reflection/increased absorption of the UV signal in the semiconductor ultraviolet radiation detection material layer 18 now makes the thickness of the semiconductor ultraviolet radiation detection material layer 18 vary over a wide range to accommodate construction of the IR, AR layers 14, 18, 40 while maintaining total absorption, of the UV in a very thin the semiconductor ultraviolet radiation detection material layer 18, typically in the range of 0.5 microns to 2 microns.

A number of embodiments of the disclosure have been described. Nevertheless, it will be understood that various modifications may be made without departing from the spirit and scope of the disclosure. For example, AR coating material may vary as long as the refractive index remains near the initial value, the semiconductor ultraviolet radiation detection material layer may vary in thickness as long as it stays within the phase delay required for AR effectiveness. Further, it should be understood that the term vapor deposition includes Chemical Vapor Deposition (including, for example, plasma assisted, magnetron assisted, microwave assisted, hot walls assisted Chemical Vapor Deposition), physical vapor deposition, such as sputtering, or evaporation, for example. Accordingly, other embodiments are within the scope of the following claims.

What is claimed is:

1. A dual band infrared and ultraviolet radiation detector, comprising:
   an infrared radiation detector;
   an infrared radiation filter, disposed over infrared radiation detector, the infrared radiation filter being transparent to infrared radiation band and absorptive to radiation adjacent to the infrared radiation band; and
   an ultraviolet radiation detector disposed over the infrared radiation filter, the ultraviolet radiation detector comprising:
      a Schottky contact metal layer on an upper surface of the infrared radiation filter;
      a layer of vapor deposited semiconductor, ultraviolet radiation detector material disposed directly on and forming a Schottky contact with, the Schottky contact metal layer; and
      an ohmic contact metal in ohmic contact with a portion of the layer of the semiconductor, ultraviolet radiation detector material;
   wherein radiation in both the infrared band and in the ultraviolet band passes to the ultraviolet radiation detector;
   wherein the ultraviolet radiation is intercepted and detected by the ultraviolet radiation detector and infrared radiation passes through the ultraviolet radiation detector is intercepted and detected by the infrared radiation detector.

2. The dual band infrared and ultraviolet radiation detector recited in claim 1 wherein the layer of semiconductor, ultraviolet radiation detector material is a vapor deposited layer.

3. The dual band infrared and ultraviolet radiation detector recited in claim 2 wherein the Schottky contact metal layer and the ohmic contact metal layer are disposed on opposite surfaces of the layer of semiconductor, ultraviolet radiation detector material.

4. The dual band infrared and ultraviolet radiation detector recited in claim 3 wherein the layer of semiconductor, ultraviolet radiation detector material has a thickness in a range of 0.25 to 2 micron.

5. The dual band infrared and ultraviolet radiation detector recited in claim 3 wherein the Schottky contact metal layer extends laterally along a surface of the layer of semiconductor, ultraviolet radiation detector material and wherein the layer of semiconductor, ultraviolet radiation detector material has a c-axis perpendicular to the upper surface of the layer of semiconductor, ultraviolet radiation detector material.

6. The dual band infrared and ultraviolet radiation detector recited in claim 1 including an anti-reflection layer disposed between an upper surface of the infrared radiation filter and the Schottky contact metal.

7. The dual band infrared and ultraviolet radiation detector recited in claim 6 wherein the anti-reflection layer reflects ultraviolet energy passing through from the layer of semiconductor, ultraviolet radiation detector material is reflected back to the layer of semiconductor, ultraviolet radiation detector material.

8. A dual band infrared (IR) and ultraviolet (UV) radiation detector, comprising:
   an infrared radiation (IR) detector;
   an infrared radiation filter, disposed over infrared radiation detector, the infrared radiation filter being transparent to infrared radiation band and absorptive to radiation adjacent to the infrared radiation band; and
   an ultraviolet radiation detector disposed over the infrared radiation filter, the ultraviolet radiation detector comprising:
      an anti-reflection structure for the IR detector, comprising:
         a layer of a semiconductor, ultraviolet radiation detector material for detecting UV radiation; and
         an IR anti-reflection glass disposed under the layer of semiconductor, ultraviolet radiation detector material;
      wherein the IR anti-reflection glass index of refraction is greater than the index of refraction of the layer of semiconductor, ultraviolet radiation detector material;
      wherein UV energy passing through the layer of semiconductor, ultraviolet radiation detector material is reflected by the IR anti-reflection glass back to the layer of semiconductor, ultraviolet radiation detector material for absorption by the layer of semiconductor, ultraviolet radiation detector material.

9. A dual band infrared (IR) and ultraviolet (UV) radiation detector, comprising:
   an infrared radiation (IR) detector;
   an infrared radiation filter, disposed over infrared radiation detector, the infrared radiation filter being transparent to infrared radiation band and absorptive to radiation adjacent to the infrared radiation band; and
   an ultraviolet radiation detector structure disposed over the infrared radiation filter, the ultraviolet radiation detector structure comprising:
      a first infrared anti-reflection layer disposed on the infrared radiation filter;
      a semiconductor, ultraviolet radiation detector disposed over the first infrared anti-reflection layer;
      a second infrared anti-reflection layer disposed on the semiconductor, ultraviolet radiation detector.

10. A dual band infrared (IR) and ultraviolet (UV) radiation detector recited in claim 9 wherein: the index of refraction of the second infrared anti-reflection layer to IR radiation is less than the index of refraction of the semiconductor, ultraviolet radiation detector to IR radiation; the index of refraction of the semiconductor, ultraviolet radiation detector to IR radiation is less than the index of refraction of first infrared anti-reflection layer; and the index of refraction of first infrared anti-reflection layer is less than the index of refraction of the infrared radiation filter.

11. An ultraviolet radiation detector structure disposed over an infrared radiation filter, the ultraviolet radiation detector structure, comprising:
   a first infrared anti-reflection layer disposed on the infrared radiation filter;
   a semiconductor, ultraviolet radiation detector disposed over the first infrared anti-reflection layer;

a second infrared anti-reflection layer disposed on the semiconductor, ultraviolet radiation detector;

including a Schottky contact metal disposed between the first infrared anti-reflection layer and the semiconductor, ultraviolet radiation detector.

12. The ultraviolet radiation detector structure recited in claim 11 wherein the semiconductor, ultraviolet radiation detector is in Schottky contact with the Schottky contact metal.

13. An ultraviolet radiation detector structure disposed over an infrared radiation filter, the ultraviolet radiation detector structure, comprising:

a first infrared anti-reflection layer disposed on the infrared radiation filter;

a semiconductor, ultraviolet radiation detector disposed over the first infrared anti-reflection layer;

a second infrared anti-reflection layer disposed on the semiconductor, ultraviolet radiation detector;

wherein the first infrared anti-reflection layer reflects ultraviolet energy passing through from the semiconductor, ultraviolet radiation detector back to the semiconductor, ultraviolet radiation detector.

14. An ultraviolet radiation detector structure disposed over an infrared radiation filter, the ultraviolet radiation detector structure, comprising:

a first infrared anti-reflection layer disposed on the infrared radiation filter;

a semiconductor, ultraviolet radiation detector disposed over the first infrared anti-reflection layer;

a second infrared anti-reflection layer disposed on the semiconductor, ultraviolet radiation detector wherein the semiconductor, ultraviolet radiation detector has a thickness in a range of 0.25 to 2 microns.

15. The ultraviolet radiation detector structure recited in claim 14 wherein the semiconductor, ultraviolet radiation detector is CdS.

16. The ultraviolet radiation detector structure recited in claim 14 wherein the semiconductor, ultraviolet radiation detector is CdSe.

17. The ultraviolet radiation detector structure recited in claim 14 wherein the semiconductor, ultraviolet radiation detector is CdTe.

* * * * *